(12) United States Patent
Ono

(10) Patent No.: US 10,142,569 B2
(45) Date of Patent: *Nov. 27, 2018

(54) IMAGING DEVICE, IMAGING METHOD, AND IMAGE PROCESSING PROGRAM

(71) Applicant: FUJIFILM Corporation, Tokyo (JP)

(72) Inventor: Shuji Ono, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/499,911

(22) Filed: Apr. 28, 2017

(65) Prior Publication Data
US 2017/0257581 A1 Sep. 7, 2017

Related U.S. Application Data

(63) Continuation of application No. PCT/JP2015/080049, filed on Oct. 26, 2015.

(30) Foreign Application Priority Data

Nov. 20, 2014 (JP) .................................. 2014-235912

(51) Int. Cl.
*H04N 5/357* (2011.01)
*G02B 13/00* (2006.01)
(Continued)

(52) U.S. Cl.
CPC ....... *H04N 5/3572* (2013.01); *G02B 13/0085* (2013.01); *G03B 19/07* (2013.01);
(Continued)

(58) Field of Classification Search
CPC ......................... H04N 5/3572; G02B 13/0085
See application file for complete search history.

(56) References Cited

U.S. PATENT DOCUMENTS 8,605,198 B2 12/2013 Ono
9,124,876 B2 9/2015 Ono
(Continued)

FOREIGN PATENT DOCUMENTS

EP 2750374 7/2014
EP 2881775 6/2015
(Continued)

OTHER PUBLICATIONS

"Search Report of European Counterpart Application," dated Sep. 8, 2017, p. 1-p. 8, in which the listed references were cited.
(Continued)

*Primary Examiner* — Ahmed A Berhan
(74) *Attorney, Agent, or Firm* — JCIPRNET

(57) ABSTRACT

The imaging device includes a multiple-property lens that includes a first area having a first property and a second area having a second property different from the first property, an image sensor in which a first light receiving element 25A having a first microlens and a second light receiving element 25B having a second microlens having a different focusing degree from the first microlens are two-dimensionally arranged, and a crosstalk removal processing unit that removes a crosstalk component from each of a first crosstalk image acquired from the first light receiving element 25A of the image sensor and a second crosstalk image acquired from the second light receiving element to generate a first image and a second image respectively having the first property and the second property of the multiple-property lens.

20 Claims, 17 Drawing Sheets

(51) Int. Cl.
  *G03B 19/07* (2006.01)
  *H04N 5/232* (2006.01)
  *H04N 5/225* (2006.01)
  *H04N 5/369* (2011.01)

(52) U.S. Cl.
  CPC ............ *H04N 5/225* (2013.01); *H04N 5/232* (2013.01); *H04N 5/369* (2013.01)

(56) References Cited

U.S. PATENT DOCUMENTS

| | | |
|---|---|---|
| 9,197,827 B2 | 11/2015 | Ono |
| 2002/0121652 A1* | 9/2002 | Yamasaki ............... G02B 7/34 257/222 |
| 2005/0225655 A1 | 10/2005 | Suzuki |
| 2015/0009369 A1 | 1/2015 | Ono |
| 2015/0156478 A1 | 6/2015 | Ono |

FOREIGN PATENT DOCUMENTS

| | | |
|---|---|---|
| JP | 2005-286104 | 10/2005 |
| JP | 2012-253670 | 12/2012 |
| WO | 2012043212 | 4/2012 |
| WO | 2013027507 | 2/2013 |
| WO | 2013146506 | 10/2013 |
| WO | 2014024745 | 2/2014 |

OTHER PUBLICATIONS

"International Preliminary Report on Patentability (Form PCT/IPEA/409) of PCT/JP2015/080049", dated Jun. 14, 2016, with English translation thereof, pp. 1-7.

"International Search Report (Form PCT/ISA/210) of PCT/JP2015/080049", dated Jan. 12, 2016, with English translation thereof, pp. 1-4.

"Office Action of Europe Counterpart Application," dated May 22, 2018, p1-p5.

* cited by examiner

FIG. 12

$$\begin{pmatrix} W1 \\ T1 \end{pmatrix} = \begin{pmatrix} A & B \\ C & D \end{pmatrix}^{-1} * \begin{pmatrix} W2 \\ T2 \end{pmatrix} \quad \cdots (1)$$

where the inverse matrix is $M^{-1}$.

FIG. 13

$$W1 = \begin{pmatrix} w1\_11 & w1\_12 & w1\_13 & & \\ w1\_21 & w1\_22 & & & \\ w1\_31 & & & & \\ & & & \ddots & \\ & & & & w1\_mn \end{pmatrix}$$

FIG. 14

$$w1\_ij = \frac{dij \cdot w2\_ij - bij \cdot t2\_ij}{aij \cdot dij - bij \cdot cij} \quad \cdots (2)$$

FIG. 15

$$t1\_ij = \frac{-cij \cdot w2\_ij + aij \cdot t2\_ij}{aij \cdot dij - bij \cdot cij} \quad \cdots (3)$$

IMAGING DEVICE, IMAGING METHOD, AND IMAGE PROCESSING PROGRAM

CROSS-REFERENCE TO RELATED APPLICATIONS

This application is a Continuation of PCT International Application No. PCT/JP2015/080049 filed on Oct. 26, 2015, which claims priority under 35 U.S.C § 119(a) to Patent Application No. 2014-235912 filed in Japan on Nov. 20, 2014, all of which are hereby expressly incorporated by reference into the present application.

BACKGROUND OF THE INVENTION

1. Field of the Invention

The present invention relates to an imaging device, an imaging method, and an image processing program and particularly to an imaging device, an imaging method, and an image processing program that can acquire a plurality of images having different properties at the same time.

2. Description of the Related Art

An imaging device that includes a multiple-property lens and a directional sensor is suggested in the related art (JP2012-253670A and WO2012/043212A). The multiple-property lens includes a first area having a first property and a second area having a second property that is different from the first property. The directional sensor receives a luminous flux passing the first area of the multiple-property lens and a luminous flux passing the second area by pupil division and can acquire a first image having the first property and a second image having the second property at the same time.

The directional sensor is configured to have an angular property with respect to light detection sensitivity, and the following directional sensors are disclosed in JP2012-253670A and WO2012/043212A.

(1) A directional sensor that is caused to have an angular property with respect to light detection sensitivity for each light receiving cell by allocating one microlens to a plurality of light receiving cells.

(2) A directional sensor that is caused to have an angular property with respect to light detection sensitivity by arranging a light shielding mask near a light receiving cell and shielding a luminous flux passing a first area of a multiple-property lens or a luminous flux passing a second area of the multiple-property lens.

(3) A directional sensor that is caused to have an angular property with respect to light detection sensitivity by a prism element by disposing, for each light receiving cell, the prism element functioning as a prism.

The imaging devices disclosed in JP2012-253670A and WO2012/043212A can image various images having different properties at the same time with the single directional sensor and the multiple-property lens by combining the multiple-property lens having different properties according to a location in a pupil area and the directional sensor having an angular property with respect to light detection sensitivity.

Also suggested is an imaging device that can image various images having different properties at the same time by using a directional sensor in which a light shielding mask is disposed in only a part of light receiving cells (WO2013/027507A).

The imaging device disclosed in WO2013/027507A includes a multiple-property lens and a directional sensor. In the multiple-property lens, a proportion a occupied by a first area of the multiple-property lens is different from a proportion b occupied by a second area of the multiple-property lens (a<b). The directional sensor includes a first light receiving cell in which a light shielding mask is disposed to cause only a luminous flux passing the first area of the multiple-property lens to be incident, and a second light receiving cell on which luminous fluxes passing the first area and the second area of the multiple-property lens are incident. A first image having the property of the first area is acquired from the first light receiving cell of the directional sensor, and a second image having first and second properties is acquired from the second light receiving cell. While the first property and the second property of the multiple-property lens are mixed in the second image, the second image mainly has the second property since the proportion b occupied by the second area is greater than the proportion a occupied by the first area.

While the directional sensors disclosed in JP2012-253670A and WO2012/043212A are configured to have an angular property with respect to light detection sensitivity, it is difficult to perform accurate pupil division of a luminous flux passing the first area of the multiple-property lens and a luminous flux passing the second area of the multiple-property lens, to cause the luminous flux passing the first area to be incident on only the first light receiving cell, and to cause the luminous flux passing the second area to be incident on only the second light receiving cell. The first image includes a crosstalk component that indicates the property of the second area of the multiple-property lens, and the second image includes a crosstalk component that indicates the property of the first area. The second light receiving cell of the directional sensor disclosed in WO2013/027507A does not have an angular property with respect to light detection sensitivity. Thus, the second image acquired from the second light receiving cell includes a crosstalk component that indicates the first property of the multiple-property lens.

In WO2013/146506A, disclosed is a method for removing or reducing a crosstalk component from each of a first image and a second image by image processing. In JP2005-286104A, disclosed is a color solid-state imaging device that has different light reception areas of a first light receiving cell and a second light receiving cell (light receiving section) arranged in panes (checker pattern).

SUMMARY OF THE INVENTION

The directional sensor in which one microlens is installed for a plurality of light receiving cells has a significantly different structure from a typical image sensor, and a large microlens has to be installed with high accuracy. Thus, posed is the problem of difficulty in manufacturing or adjustment.

The directional sensor in which the light shielding mask or the prism element is arranged is required to have the light shielding mask or the prism element, which are not required for a typical image sensor, added as a structure of each light receiving cell. This poses the problem of increasing cost or hindering the light receiving cell from having a very small size (a pixel pitch or a thickness).

In the case of the imaging device disclosed in WO2013/027507A, the light shielding mask is not disposed in a part of the light receiving cells of the directional sensor. However, a structure (light shielding mask) is still required to be embedded in other light receiving cells of the directional sensor, and the problem of increasing cost or hindering the light receiving cell from having a very small size (a pixel pitch or a thickness) is not resolved.

The color solid-state imaging device disclosed in JP2005-286104A has different light reception areas of the first light receiving cell and the second light receiving cell arranged in panes. However, this is to generate a high dynamic range image by imaging a high-sensitivity image and a low-sensitivity image at the same time. That is, JP2005-286104A does not have the idea of imaging the first image and the second image having the property of the first area and the property of the second area of the multiple-property lens at the same time.

The present invention is conceived in view of such matters, and an object thereof is to provide an imaging device, an imaging method, and an image processing program that can image, at the same time, images corresponding to each property of a multiple-property lens having a plurality of properties by using an image sensor having the same structure as a typical image sensor and that, accordingly, can make a sensor pixel of the image sensor very small or reduce the number or cost of manufacturing steps.

An imaging device according to one embodiment of the present invention for achieving the object comprises a multiple-property lens that includes a first area having a first property and a second area having a second property different from the first property, an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged, and a crosstalk removal processing unit that removes a crosstalk component from each of a first crosstalk image acquired from the first light receiving element of the image sensor and a second crosstalk image acquired from the second light receiving element to generate a first image and a second image respectively having the first property and the second property of the multiple-property lens.

According to one embodiment of the present invention, a luminous flux passing the first area of the multiple-property lens and a luminous flux passing the second area of the multiple-property lens are permitted to be incident in crosstalk with each other on the first light receiving element and the second light receiving element of the image sensor. The first microlens disposed in the first light receiving element and the second microlens disposed in the second light receiving element of the image sensor have different focusing degrees, and therefore, crosstalk ratios of the first light receiving element and the second light receiving element are different. A crosstalk component is removed from each of the first crosstalk image acquired from the first light receiving element of the image sensor and the second crosstalk image acquired from the second light receiving element to generate the first image and the second image respectively having the first property and the second property of the multiple-property lens. The image sensor according to the present invention has different focusing degrees of the first microlens disposed in the first light receiving element and the second microlens disposed in the second light receiving element but does not have an additional structure compared with a typical image sensor. Thus, a sensor pixel can be made very small, and the number or cost of manufacturing steps can be reduced. The expression "property" referred hereto is a concept that contains the meaning of "optical property".

An imaging device according to another embodiment of the present invention comprises a multiple-property lens that includes a first area having a first property and a second area having a second property different from the first property, an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other being two-dimensionally arranged, and a crosstalk removal processing unit that removes a crosstalk component from each of a first crosstalk image acquired from the first light receiving element of the image sensor and a second crosstalk image acquired from the second light receiving element to generate a first image and a second image respectively having the first property and the second property of the multiple-property lens.

Since in the second light receiving element not having a microlens, image forming and converging operation of the luminous flux passing the first area of the multiple-property lens and the luminous flux passing the second area of the multiple-property lens are not performed, the first light receiving element having a microlens and the second light receiving element not having a microlens have different focusing degrees on a light receiving surface of a pupil image of the multiple-property lens. As a result, crosstalk ratios of the luminous flux passing the first area and the luminous flux passing the second area that are incident on the first light receiving element and the second light receiving element are different. Therefore, it is possible to remove a crosstalk component from each of a first crosstalk image acquired from the first light receiving element of the image sensor and a second crosstalk image acquired from the second light receiving element to generate a first image and a second image respectively having the first property and the second property of the multiple-property lens.

In the imaging device according to still another embodiment of the present invention, the crosstalk removal processing unit preferably calculates the first image and the second image on the basis of the first crosstalk image, the second crosstalk image, and an inverse matrix of a matrix configured of a detected gain distribution and a crosstalk gain distribution of each of the first crosstalk image and the second crosstalk image. The detected gain distribution and the crosstalk gain distribution are distribution information related to each of imaging light passing the first area having the first property of the multiple-property lens and imaging light passing the second area having the second property of the multiple-property lens. The detected gain distribution indicates a distribution (information data) of imaging light that is appropriately intentionally received by the light receiving element. The detected gain distribution is represented by, for example, "a distribution (information data) of imaging light, of imaging light received by the first light receiving element corresponding to the first area, that passes the first area" and "a distribution (information data) of imaging light, of imaging light received by the second light receiving element corresponding to the second area, that passes the second area". The crosstalk gain distribution indicates a distribution (information data) of imaging light that is inappropriately unintentionally received in the first light receiving element and the second light receiving element. The crosstalk gain distribution is represented by, for example, "a distribution (information data) of imaging light, of imaging light received by the first light receiving element corresponding to the first area, that passes the second area" and "a distribution (information data) of imaging light, of imaging light received by the second light receiving element corresponding to the second area, that passes the first area".

In the imaging device according to still another embodiment of the present invention, the first microlens and the second microlens are respectively disposed in each first light receiving element and each second light receiving element. The first microlens forms, on a light receiving surface of the first light receiving element, a pupil image of the multiple-property lens at a first focusing degree, and the second microlens forms, on a light receiving surface of the second light receiving element, a pupil image of the multiple-property lens at a second focusing degree that is different from the first focusing degree. Since the focusing degrees of the first microlens and the second microlens are different, a crosstalk ratio of a luminous flux passing the first area of the multiple-property lens and a luminous flux passing the second area of the multiple-property lens that are incident on the light receiving surface of the first light receiving element through the first microlens, and a crosstalk ratio of a luminous flux passing the first area of the multiple-property lens and a luminous flux passing the second area of the multiple-property lens that are incident on the light receiving surface of the second light receiving element through the second microlens are different. The pupil image of the multiple-property lens on the light receiving surface of each light receiving element varies in size according to the focusing degree. The pupil image of the multiple-property lens on the light receiving surface of each light receiving element is blur and large as the focusing degree is low.

In the imaging device according to still another embodiment of the present invention, the first microlens and the second microlens are different from each other in terms of at least one of a radius of curvature or a distance from the light receiving surface of the first light receiving element and from the light receiving surface of the second light receiving element.

In the imaging device according to still another embodiment of the present invention, the image sensor is preferably a rear surface irradiation image sensor. The rear surface irradiation image sensor has not only an advantage of making a pixel size very small but also an advantage of high sensitivity due to high efficiency of use of light. The rear surface irradiation image sensor does not have a circuit layer on the incident surface side of the light receiving section. Thus, a technology in the related art that uses a part of a circuit layer for a light shielding mask cannot be applied to the rear surface irradiation image sensor. However, since the image sensor according to the present invention does not use a light shielding mask, the present invention can be applied to the rear surface irradiation image sensor.

In the imaging device according to still another embodiment of the present invention, the multiple-property lens includes a first optical system corresponding to the first area having the first property and a second optical system corresponding to the second area having the second property.

In the imaging device according to still another embodiment of the present invention, the first optical system and the second optical system preferably have a common optical axis. Further preferably, the first optical system is a circular central optical system, and the second optical system is an annular optical system that is concentrically arranged with respect to the central optical system. Configuring the first optical system and the second optical system as rotationally symmetric optical systems can acquire the first image and the second image of good image quality compared with a non rotationally symmetric optical system without causing a parallax between the first image and the second image.

In the imaging device according to still another embodiment of the present invention, the first optical system and the second optical system are different from each other in terms of at least one of a focal length, a focal distance, or a modulation transfer function.

The invention according to still another embodiment is an imaging method in an imaging device including a multiple-property lens that includes a first area having a first property and a second area having a second property different from the first property, and an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged, the method comprising a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element, and a step of generating a first image and a second image respectively having the first property and the second property of the multiple-property lens by removing a crosstalk component from each of the first crosstalk image and the second crosstalk image acquired.

The invention according to still another embodiment is an imaging method in an imaging device including a multiple-property lens that includes a first area having a first property and a second area having a second property different from the first property, and an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other being two-dimensionally arranged, the method comprising a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element, and a step of generating a first image and a second image respectively having the first property and the second property of the multiple-property lens by removing a crosstalk component from each of the first crosstalk image and the second crosstalk image acquired.

In the imaging method according to still another embodiment of the present invention, in the step of generating the first image and the second image, the first image and the second image are preferably calculated on the basis of the first crosstalk image, the second crosstalk image, and an inverse matrix of a matrix configured of a detected gain distribution and a crosstalk gain distribution of each of the first crosstalk image and the second crosstalk image.

The invention according to still another embodiment is an image processing program of an imaging device including a multiple-property lens that includes a first area having a first property and a second area having a second property different from the first property, and an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged, the program causing a computer to realize a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element, and a step of generating a first image and a second image respectively having the first property and the second property of the multiple-property lens by removing a crosstalk component from each of the first crosstalk image and the second crosstalk image acquired.

The invention according to still another embodiment is an image processing program of an imaging device including a multiple-property lens that includes a first area having a first property and a second area having a second property different from the first property, and an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other being two-dimensionally arranged, the program causing a computer to realize a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element, and a step of generating a first image and a second image respectively having the first property and the second property of the multiple-property lens by removing a crosstalk component from each of the first crosstalk image and the second crosstalk image acquired.

In the image processing program according to still another embodiment of the present invention, in the step of generating the first image and the second image, the first image and the second image are preferably calculated on the basis of the first crosstalk image, the second crosstalk image, and an inverse matrix of a matrix configured of a detected gain distribution and a crosstalk gain distribution of each of the first crosstalk image and the second crosstalk image.

According to the present invention, images corresponding to each property of a multiple-property lens having a plurality of properties can be imaged at the same by using a single image sensor, and particularly, the image sensor according to the present invention can have the same structure as a typical image sensor (an additional structure is not required). Thus, a sensor pixel can be made very small, and the number or cost of manufacturing steps can be reduced.

Figure 11:
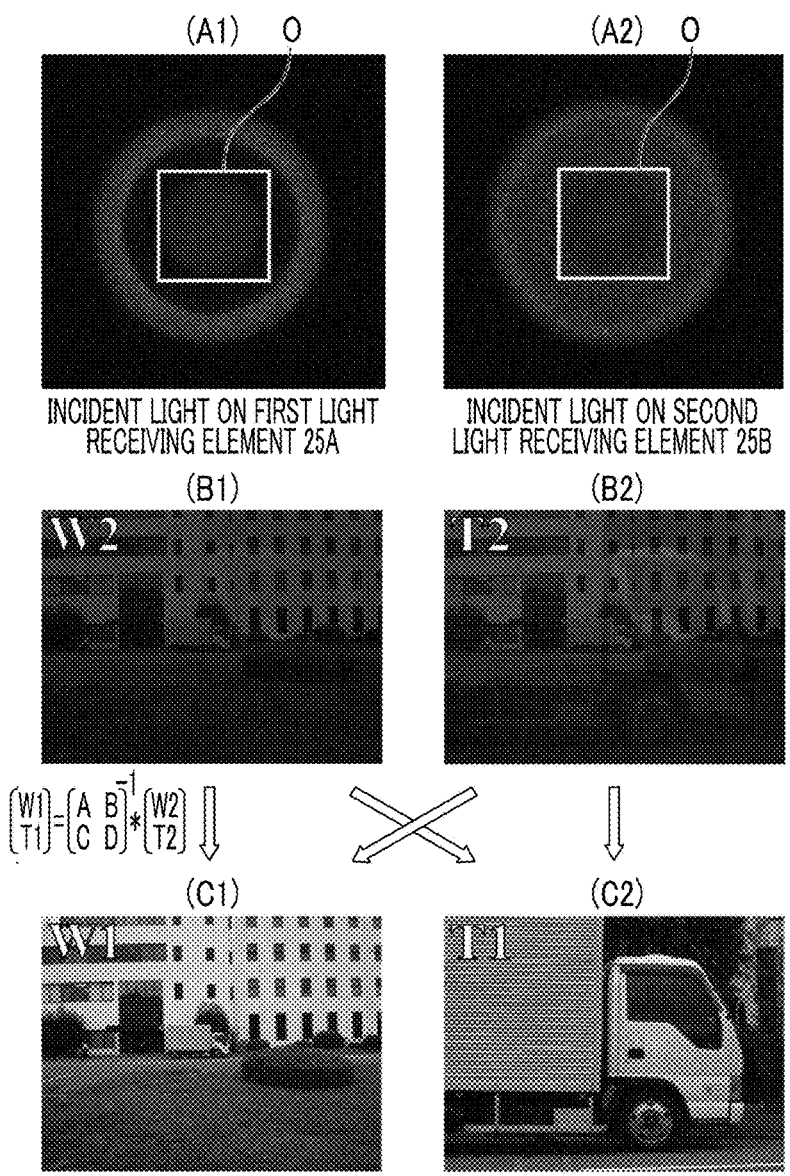

(A1) to (C2) of FIG. 11 are diagrams illustrating a simulation result of acquiring the first crosstalk image and the second crosstalk image with use of the image sensor of the present embodiment and acquiring the crosstalk-removed images (the true wide-angle image and the true telescopic image) by a crosstalk removal method.

FIG. 12 is a diagram illustrating Expression (1) that calculates a first image (true wide-angle image) and a second image (true telescopic image) from which crosstalk is removed.

FIG. 13 is a diagram illustrating elements w1_11 to w1_$mn$ constituting "W1" in Expression (1) illustrated in FIG. 12.

FIG. 14 is a diagram illustrating Expression (2) that calculates an element "w1_$ij$" corresponding to a pixel component (pixel value) constituting the first image (true wide-angle image) derived on the basis of Expression (1) illustrated in FIG. 12.

FIG. 15 is a diagram illustrating Expression (3) that calculates an element "t1_$ij$" corresponding to a pixel component (pixel value) constituting the second image (true telescopic image) derived on the basis of Expression (1) illustrated in FIG. 12.

Figure 1:
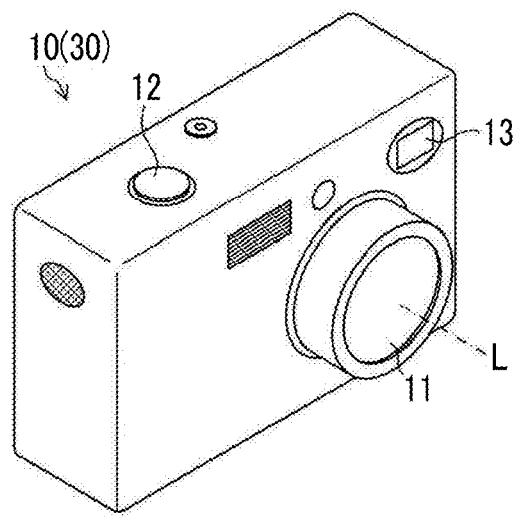
FIG. 1 is a perspective view illustrating one example of a digital camera (imaging device) to which the present invention can be applied.
Figure 2:
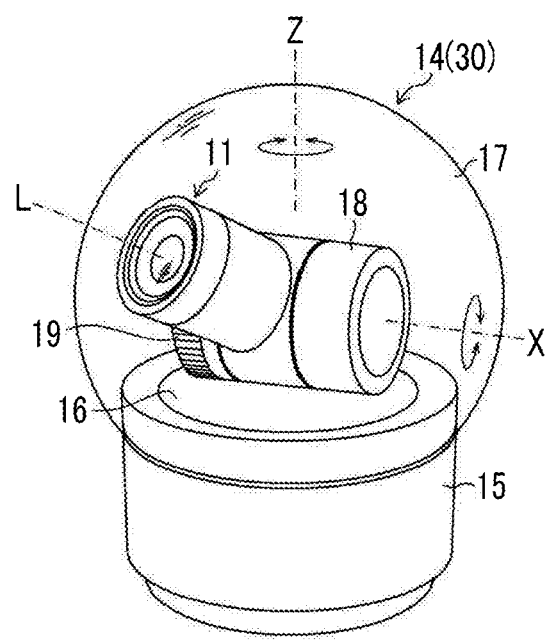
FIG. 2 is a perspective view illustrating one example of an automatic tracking imaging device (imaging device) to which the present invention can be applied.
Figure 16:
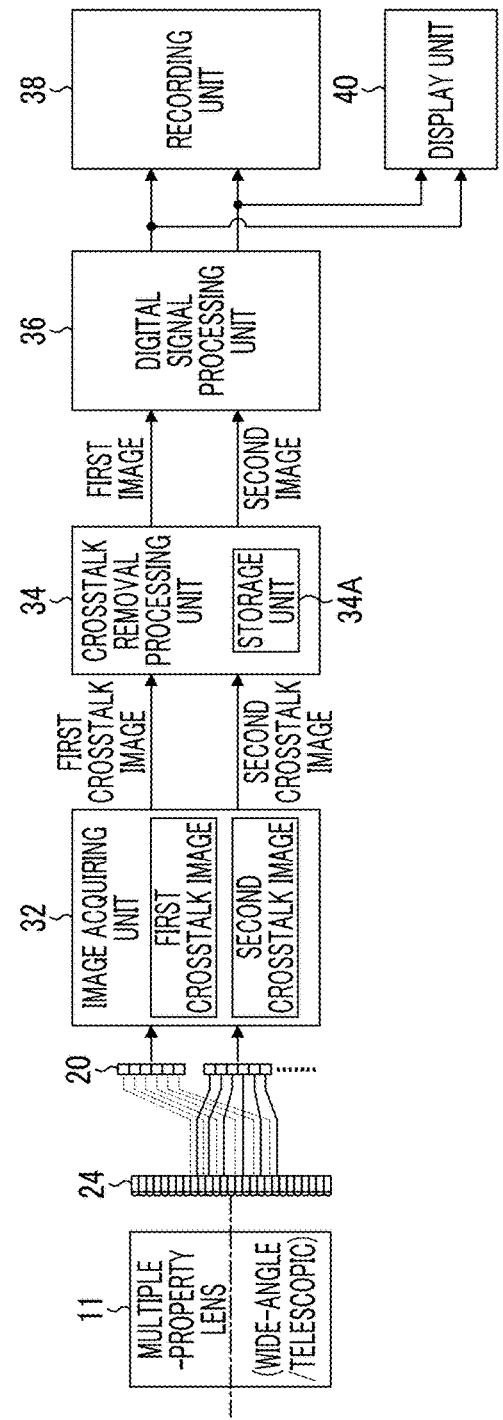

FIG. 16 is a block diagram illustrating an internal configuration of a main portion of the imaging device illustrated in FIG. 1 and FIG. 2.

Figure 17:
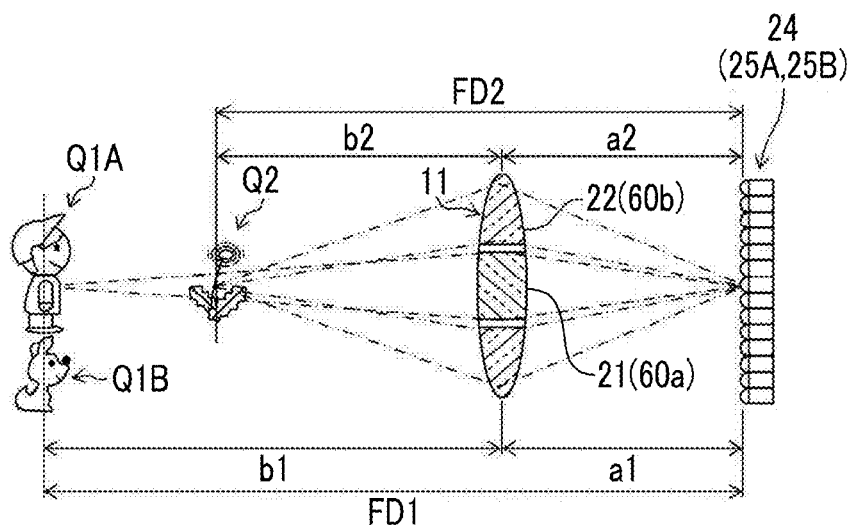

FIG. 17 is a diagram for describing an imaging mechanism that uses a multiple-property lens according to a second embodiment.

Figure 18:
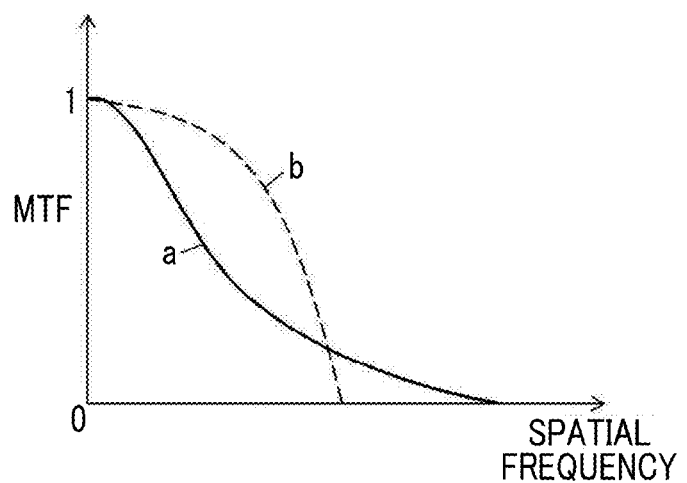

FIG. 18 is a graph illustrating modulation transfer functions (MTF) of a first optical system and a second optical system of a multiple-property lens according to a third embodiment.

Figure 19:
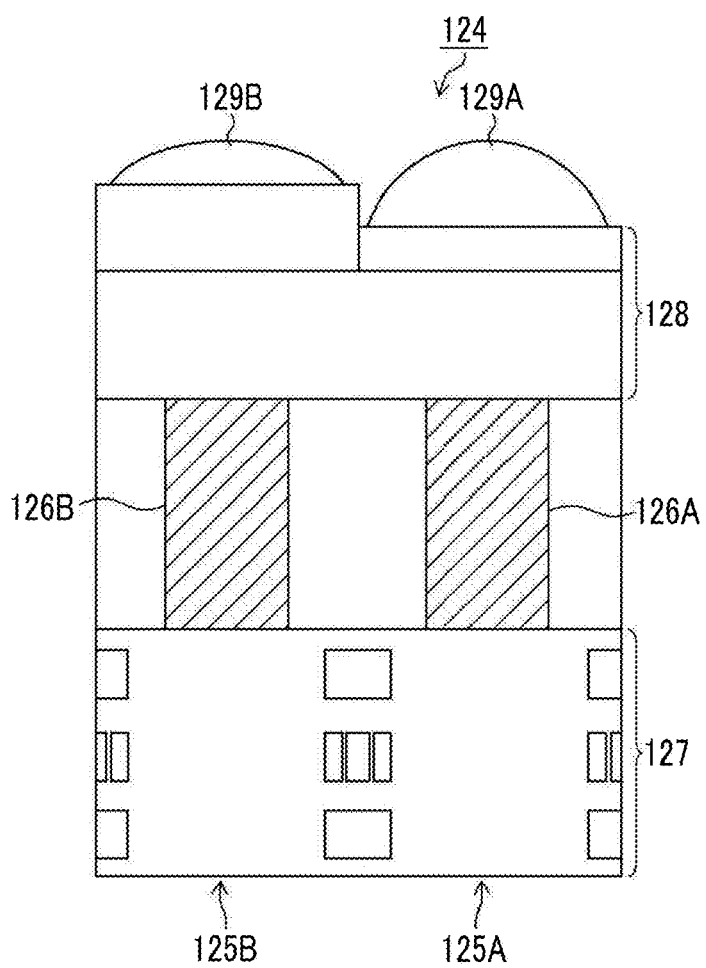

FIG. 19 is a cross-sectional view with a main portion of an image sensor of another embodiment enlarged.

Figure 20:
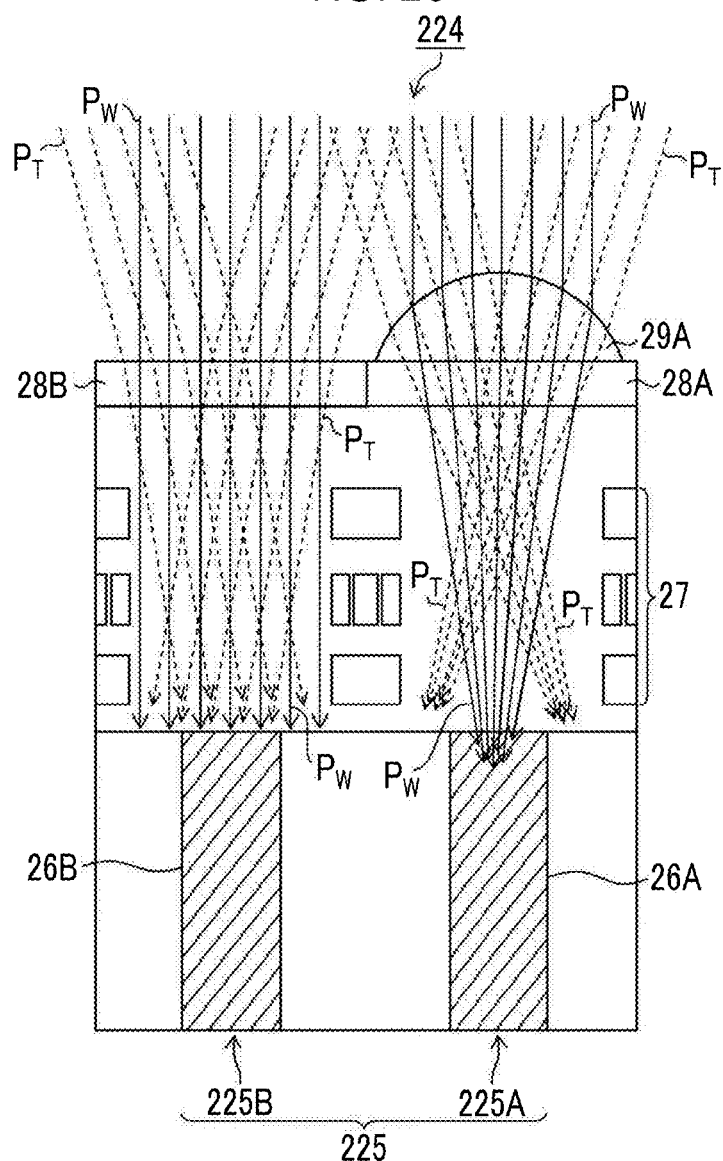

FIG. 20 is a cross-sectional view with a main portion of an image sensor of still another present embodiment enlarged.

Figure 21:
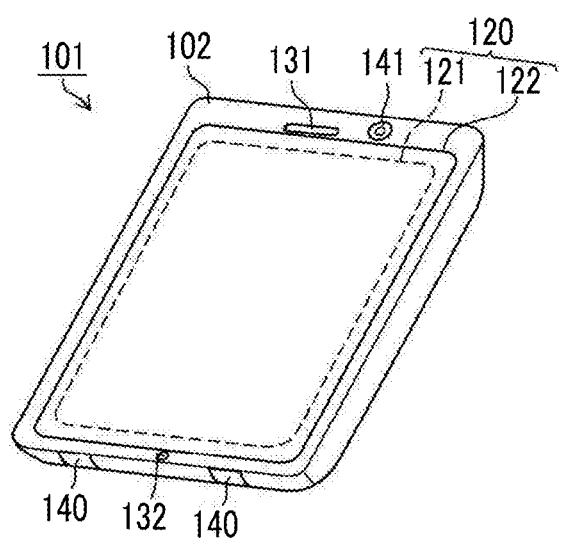

FIG. 21 is a diagram illustrating the exterior of a smartphone that is one embodiment of the imaging device of the present invention.

Figure 22:
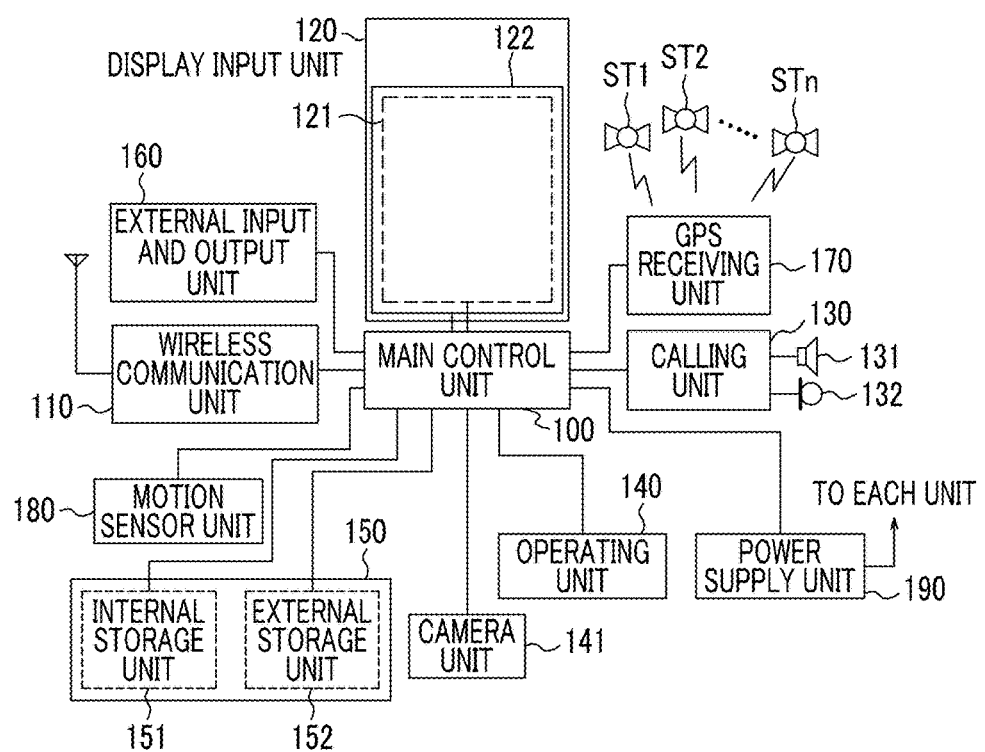

FIG. 22 is a block diagram illustrating a configuration of the smartphone illustrated in FIG. 21.

DESCRIPTION OF THE PREFERRED EMBODIMENTS

Hereinafter, embodiments of the present invention will be described with reference to the drawings.

The present invention can be widely applied to an imaging device, an imaging method, and an application technology thereof that can image a plurality of types of images with use of a multiple-property lens having a plurality of types of optical properties. The field of technology to which the present invention can be applied is not particularly limited. For example, the present invention can be applied to not only an imaging device performing imaging in response to a user operation but also an imaging device automatically performing imaging. In addition, the present invention can be applied to not only an imaging device imaging a still picture but also an imaging device imaging a motion picture.

FIG. 1 is a perspective view illustrating one example of a digital camera 10 (imaging device 30) to which the present invention can be applied. In the example illustrated in FIG. 1, a multiple-property lens 11, a flash 13, and the like are disposed on the front surface of a camera main body of the digital camera 10, and a release button 12 and the like are disposed on the upper surface of the camera main body. The reference sign "L" in FIG. 1 represents the optical axis of the multiple-property lens 11.

FIG. 2 is a perspective view illustrating one example of an automatic tracking imaging device 14 (imaging device 30) to which the present invention can be applied. In the automatic tracking imaging device 14 illustrated in FIG. 2, a holding unit 18 that includes a gear 19 and the multiple-property lens 11 that is attached to the holding unit 18 are fixedly installed on a pedestal 16 that is disposed on a device main body 15. The pedestal 16 is disposed to be rotatable with the axis of a perpendicular direction Z of the device main body 15 as a center, and a pan operation with the axis of the perpendicular direction Z as a center is performed by a pan driving unit not illustrated. The gear 19 is disposed on the same axis as the axis of a horizontal direction X. A driving force is delivered from a tilt driving unit, not illustrated, through the gear 19 to pivot the multiple-property lens 11 in the up-down direction, and thereby a tilt operation is performed. The multiple-property lens 11, the holding unit 18 (gear 19), and the pedestal 16 are covered with a dustproof and rainproof dome cover 17.

Each embodiment and each modification example of the present invention described below, for example, may be applied to the digital camera 10 illustrated in FIG. 1 or may be applied to the automatic tracking imaging device 14 illustrated in FIG. 2.

First Embodiment

Figure 3:
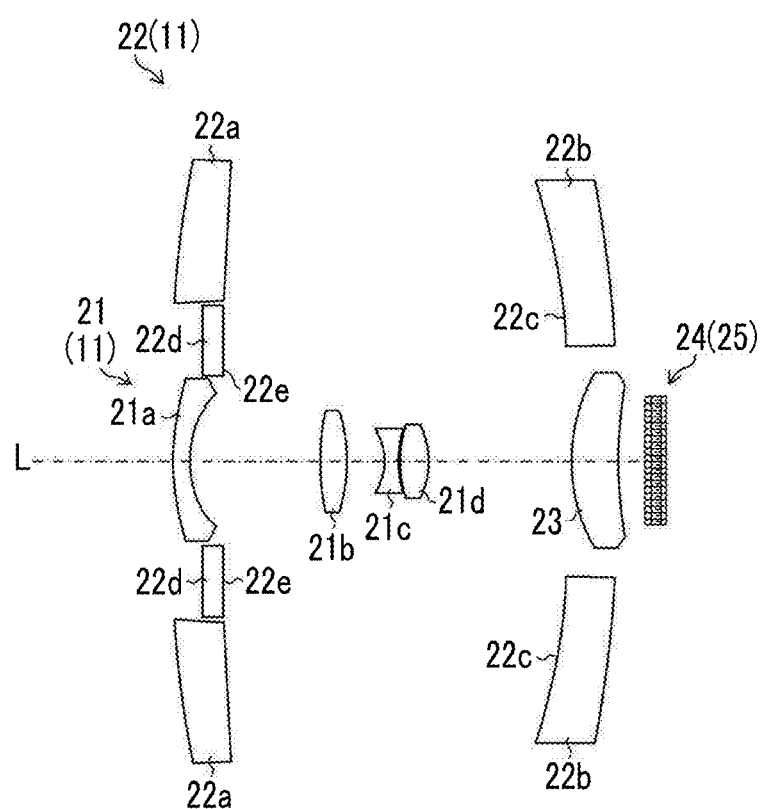
FIG. 3 illustrates a cross-sectional configuration of a multiple-property lens according to a first embodiment.

FIG. 3 is a diagram illustrating cross-sectional configurations of the multiple-property lens 11 and an image sensor 24 according to a first embodiment.

The multiple-property lens 11 includes a first area having a first property and a second area having a second property that is different from the first property. In the present embodiment, the multiple-property lens 11 is configured of a first optical system 21 corresponding to the first area and a second optical system 22 corresponding to the second area. The first optical system 21 and the second optical system 22 have different focal lengths (optical properties) and a common optical axis L. The first optical system 21 is a wide-angle lens, and the second optical system 22 is a telescopic lens. While the different optical properties (the first property and the second property different from the first property) in the multiple-property lens 11 according to the first embodiment are optical properties related to a difference in focal length (telescopic or wide-angle) as described above, the configuration of the present invention is not limited thereto. Examples of the different optical properties include different optical properties such as the case of different focal distances (positions of focus) and the case of different transmitted wavelength regions (visible light, infrared light, and the like; besides, a difference in transmitted wavelength region due to multilayer film coating, a difference in transmitted wavelength region due to coloring with a coloring agent, and the like).

The first optical system (wide-angle lens) 21 illustrated in FIG. 3 includes a first wide-angle lens 21$a$, a second wide-angle lens 21$b$, a third wide-angle lens 21$c$, a fourth wide-angle lens 21$d$, and a common lens 23 that are arranged on the same optical axis L. The second optical system (telescopic lens) 22 includes a first telescopic lens 22$a$, a first telescopic reflector 22$b$ in which a first telescopic reflective mirror 22$c$ is disposed, a second telescopic reflector 22$d$ in which a second telescopic reflective mirror 22$e$ is disposed, and the common lens 23. The first optical system 21 (particularly, the first wide-angle lens 21$a$, the second wide-angle lens 21$b$, the third wide-angle lens 21$c$, and the fourth wide-angle lens 21$d$) forms a circular central optical system. The second optical system 22 (particularly, the first telescopic lens 22a, the first telescopic reflector 22b, the first telescopic reflective mirror 22c, the second telescopic reflector 22d, and the second telescopic reflective mirror 22e) is disposed in a part around the central optical system formed by the first optical system 21 and forms an annular optical system that is concentrically arranged with respect to the central optical system formed by the first optical system 21. The common lens 23 is arranged on the optical axis L and is shared between the first optical system 21 and the second optical system 22.

Accordingly, the second optical system 22 includes a lens group (the first telescopic lens 22a and the common lens 23) and a reflective mirror group (the first telescopic reflective mirror 22c (first telescopic reflector 22b) and the second telescopic reflective mirror 22e (second telescopic reflector 22d)) disposed around a lens group (the first wide-angle lens 21a to the fourth wide-angle lens 21d and the common lens 23) constituting the first optical system 21, has the same optical axis L as the first optical system 21, and has a different focal length from the first optical system 21.

The image sensor 24 is configured to have a plurality of light receiving elements (may be referred to as "light receiving cells" or "light receiving sensors") 25 that is two-dimensionally arranged with respect to a direction forming a perpendicular with the optical axis L. Particularly, in the image sensor 24 of the present embodiment, as the plurality of light receiving elements 25, a first light receiving element 25A and a second light receiving element 25B in which the first microlens 29A and the second microlens 29B have different radius of curvatures (focusing degrees) are configured to be arranged in panes (checker pattern) as illustrated in FIG. 4.

Figure 4:
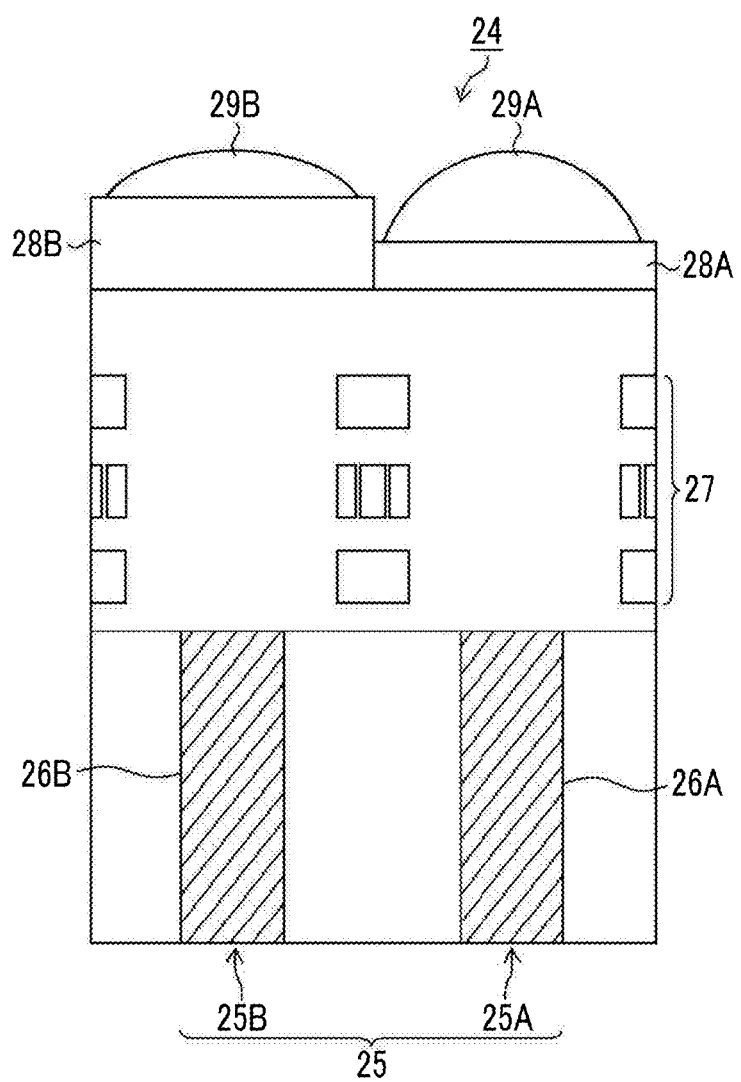
FIG. 4 is a cross-sectional view with a main portion of an image sensor of the present embodiment enlarged.

FIG. 4 is a cross-sectional view with a main portion of the image sensor 24 enlarged and illustrates the first light receiving element 25A and the second light receiving element 25B.

The image sensor 24 illustrated in FIG. 4 is a surface irradiation image sensor in which an interconnect layer 27 where an interconnect or the like for reading an image signal corresponding to charges accumulated in the first photodiode 26A and the second photodiode 26B is formed is disposed on light receiving surfaces (surfaces) of the first photodiode 26A and the second photodiode 26B. A leveling layers 28A and 28B are disposed on the incident surface side of the interconnect layer 27. The first microlens 29A and the second microlens 29B (on-chip microlens) are formed on the incident surface side of the leveling layers 28A and 28B.

The first microlens 29A and the second microlens 29B are respectively disposed in each first light receiving element 25A and for each second light receiving element 25B. The first microlens 29A and the second microlens 29B form, on the light receiving surfaces of the first photodiode 26A and second photodiode 26B, images of light of a wide-angle image and light of a telescopic image (pupil image of the multiple-property lens 11) incident on the first microlens 29A and the second microlens 29B at different focusing degree (the first focusing degree and the second focusing degree) respectively (refer to FIG. 8).

An incident ray that is incident on the first microlens 29A and the second microlens 29B has an incident angle that changes according to the distance from the center of the image sensor 24 (image height). Thus, the first microlens 29A and the second microlens 29B are preferably arranged (scaled) to be slightly shifted with respect to the light receiving element 25 according to a position on the image sensor 24 (image height). In addition, the image sensor 24 may be configured as a color image sensor by forming, for example, filters of each color of red, green, and blue instead of the leveling layers 28A and 28B or between the leveling layers 28A and 28B, and the first microlens 29A and the second microlens 29B.

Figure 5:
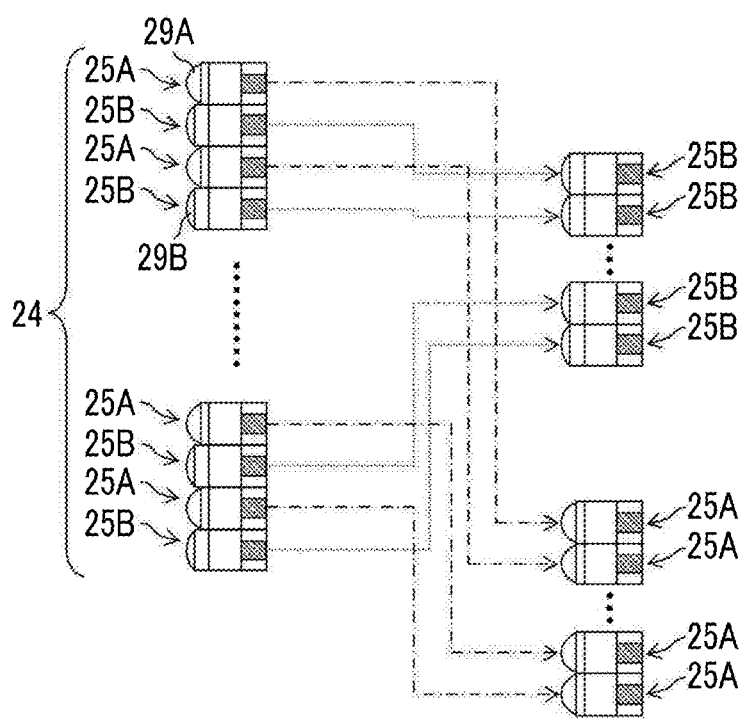
FIG. 5 is a diagram illustrating a cross-sectional configuration example of the image sensor illustrated in FIG. 3.

FIG. 5 is a diagram illustrating a cross-sectional configuration example of the image sensor 24 illustrated in FIG. 3.

As illustrated in FIG. 4, the plurality of light receiving elements 25 constituting the image sensor 24 of the present example include the first light receiving element 25A having the first microlens 29A and the second light receiving element 25B having the second microlens 29B. The first light receiving element 25A and the second light receiving element 25B are alternately two-dimensionally arranged.

A pixel signal of a group of the first light receiving elements 25A and a pixel signal of a group of the second light receiving elements 25B are distinctively read from the image sensor 24. The pixel signal of the group of the first light receiving element 25A and the pixel signal of the group of the second light receiving element 25B are acquired as a sensor output of a first crosstalk image and a sensor output of a second crosstalk image as described later.

Figure 6:
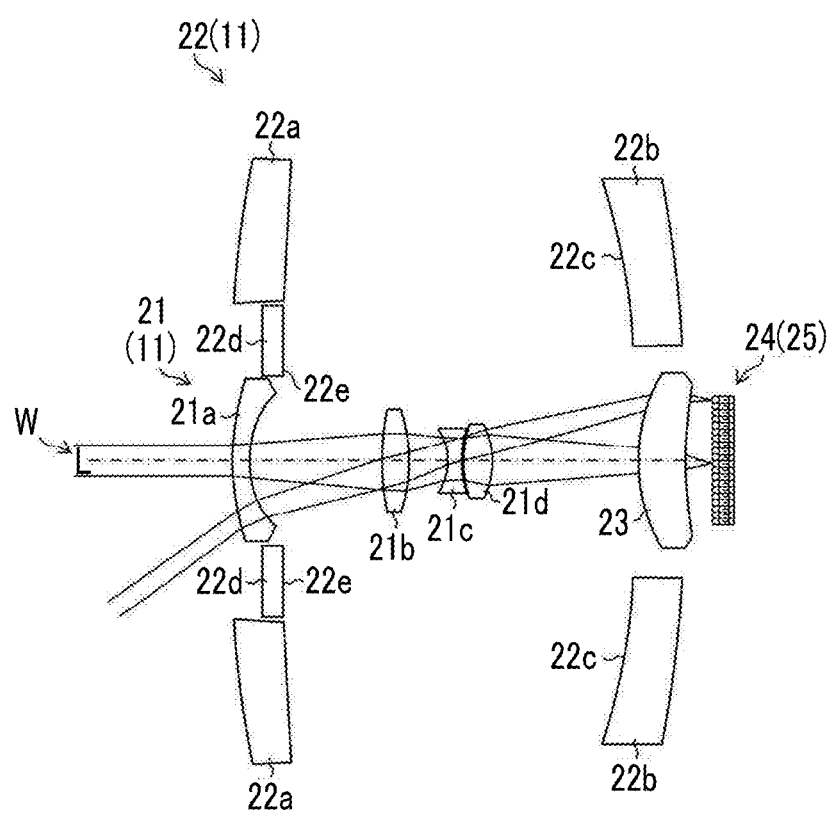
FIG. 6 is a diagram illustrating the optical path of a luminous flux of a wide-angle image that is incident on the multiple-property lens (particularly, a first optical system) and the image sensor illustrated in FIG. 3.

FIG. 6 is a diagram illustrating the optical path of a luminous flux of a wide-angle image W that is incident on the multiple-property lens 11 (particularly, the first optical system 21) and the image sensor 24 illustrated in FIG. 3. The wide-angle image W in the present embodiment passes the first wide-angle lens 21a, the second wide-angle lens 21b, the third wide-angle lens 21c, the fourth wide-angle lens 21d, and the common lens 23 of the first optical system 21 in order and is formed on the image sensor 24.

Figure 7:
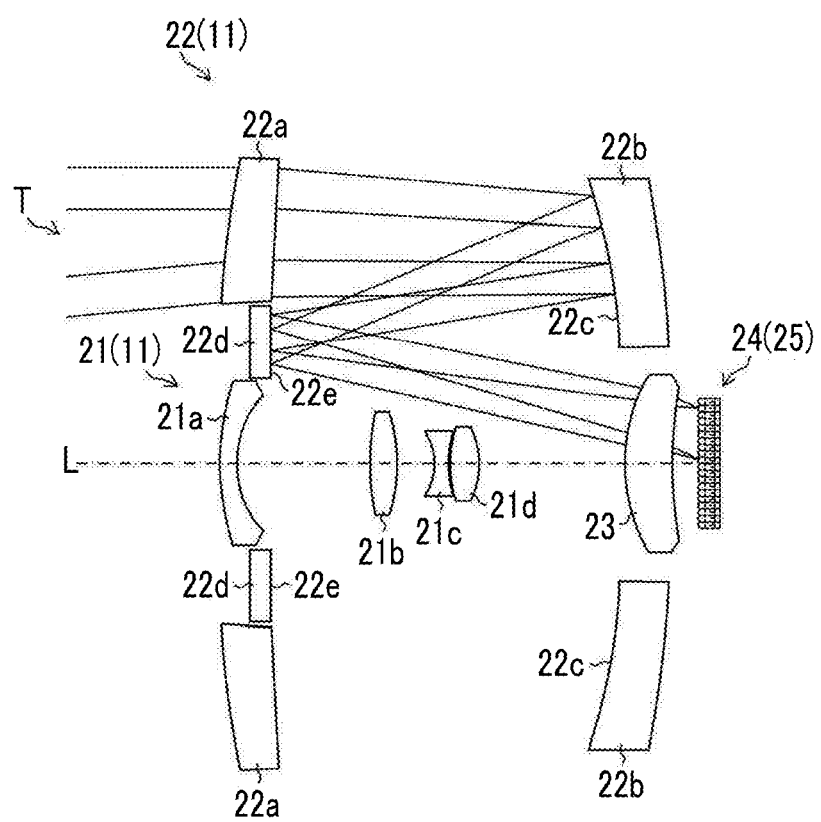
FIG. 7 is a diagram illustrating the optical path of a luminous flux of a telescopic image that is incident on the multiple-property lens (particularly, a second optical system) and the image sensor illustrated in FIG. 3.

FIG. 7 is a diagram illustrating the optical path of a luminous flux of a telescopic image T that is incident on the multiple-property lens 11 (particularly, the second optical system 22) and the image sensor 24 illustrated in FIG. 3. The telescopic image T in the present embodiment passes (is transmitted by) the first telescopic lens 22a, is reflected by each of the first telescopic reflective mirror 22c and the second telescopic reflective mirror 22e, then passes the common lens 23, and is formed on the image sensor 24. Accordingly, the optical path being folded by reflection by each of the first telescopic reflective mirror 22c and the second telescopic reflective mirror 22e can decrease the length in the direction of the optical axis L of the second optical system 22 that is for imaging of a telescopic image and has a long focal length.

As illustrated in FIG. 6 and FIG. 7, the luminous flux of the wide-angle image W and the luminous flux of the telescopic image T are incident at different angles on the image sensor 24.

Figure 8:
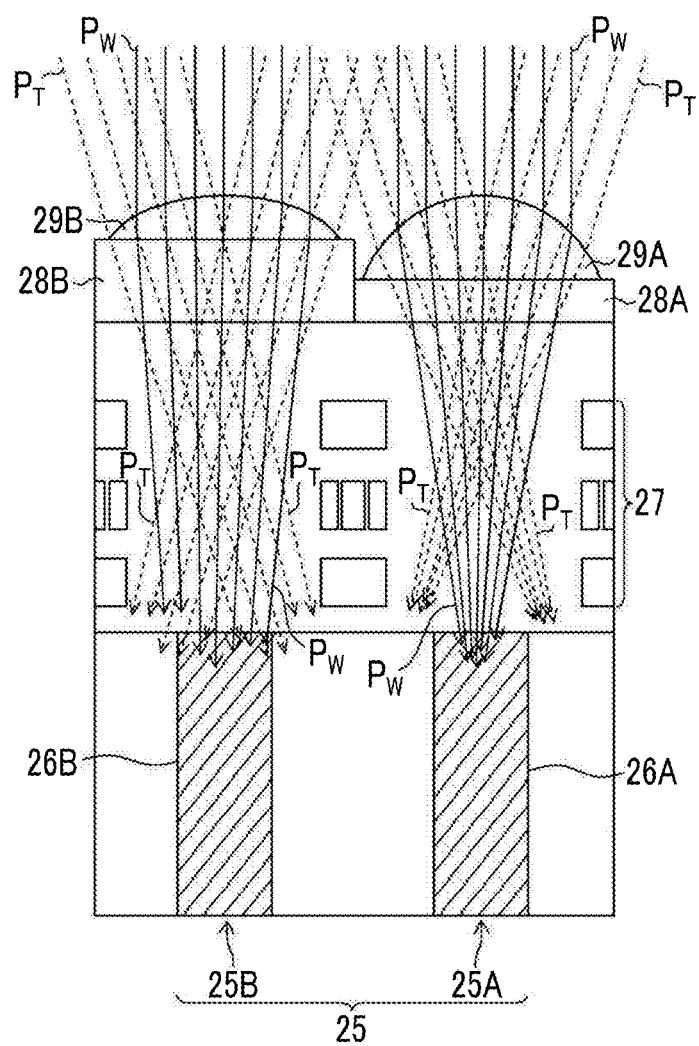
FIG. 8 is a diagram in which the optical path of the wide-angle image and the optical path of the telescopic image are added to the image sensor illustrated in FIG. 4.

FIG. 8 is a diagram in which an optical path $P_W$ of the wide-angle image W and an optical path $P_T$ of the telescopic image T are added to the image sensor 24 illustrated in FIG. 4.

As described below, the first light receiving element 25A and the second light receiving element 25B have the first microlens 29A and the second microlens 29B of different radius of curvatures (focal length) and have different focusing degrees of pupil images of the multiple-property lens 11 formed on the light receiving surface of the light receiving element 25 and thus have different light reception sensitivity properties. In the present example, while the first microlens 29A disposed in the first light receiving element 25A forms a pupil image of the multiple-property lens 11 to make the pupil image of the multiple-property lens 11 be focused on the light receiving surfaces of the first light receiving element 25A, the second microlens 29B disposed in the second light receiving element 25B forms a pupil image of the multiple-property lens 11 to make the pupil image of the multiple-property lens 11 be out of focus on the light receiving surfaces of the second light receiving element 25B.

While larger amount of light of the central portion of the pupil image (that is, light of the wide-angle image W) than light of the peripheral portion of the pupil image (light of telescopic image T) is incident on the first photodiode 26A of the first light receiving element 25A and the second photodiode 26B of the second light receiving element 25B illustrated in FIG. 8, since the pupil image of the multiple-property lens 11 is focused on the first photodiode 26A in the first light receiving element 25A, larger amount of light of the central portion of the pupil image (that is, light of the wide-angle image W) is incident on the first photodiode 26A compared with the second light receiving element 25B.

That is, while the luminous flux of the wide-angle image W and the luminous flux of the telescopic image T are respectively incident in crosstalk with each other on the first light receiving element 25A and the second light receiving element 25B of the image sensor 24, the first light receiving element 25A and the second light receiving element 25B have different crosstalk ratios. The crosstalk ratio of the telescopic image T to the wide-angle image W is small in the first light receiving element 25A. The crosstalk ratio of the telescopic image T to the wide-angle image W is very large in the second light receiving element 25B compared with the first light receiving element 25A.

Sensor outputs that indicate the first crosstalk image and the second crosstalk image having different crosstalk ratios of the telescopic image T and the wide-angle image W as above can be acquired from the plurality of first light receiving elements 25A and the plurality of second light receiving elements 25B included in the image sensor 24 as illustrated in FIG. 5.

Given that the first crosstalk image acquired from the plurality of first light receiving elements 25A included in the image sensor 24 is a sensor output W2 and that the second crosstalk image acquired from the plurality of second light receiving elements 25B included in the image sensor 24 is a sensor output T2, a desirable first image (wide-angle image W1) and a desirable second image (telescopic image T1) without crosstalk can be acquired by performing crosstalk removal processing of removing a crosstalk component from the sensor outputs W2 and T2 (the first crosstalk image and the second crosstalk image).

[Crosstalk Removal Method]

Next, a crosstalk removal method that can be applied to the present invention will be described.

Figure 9:
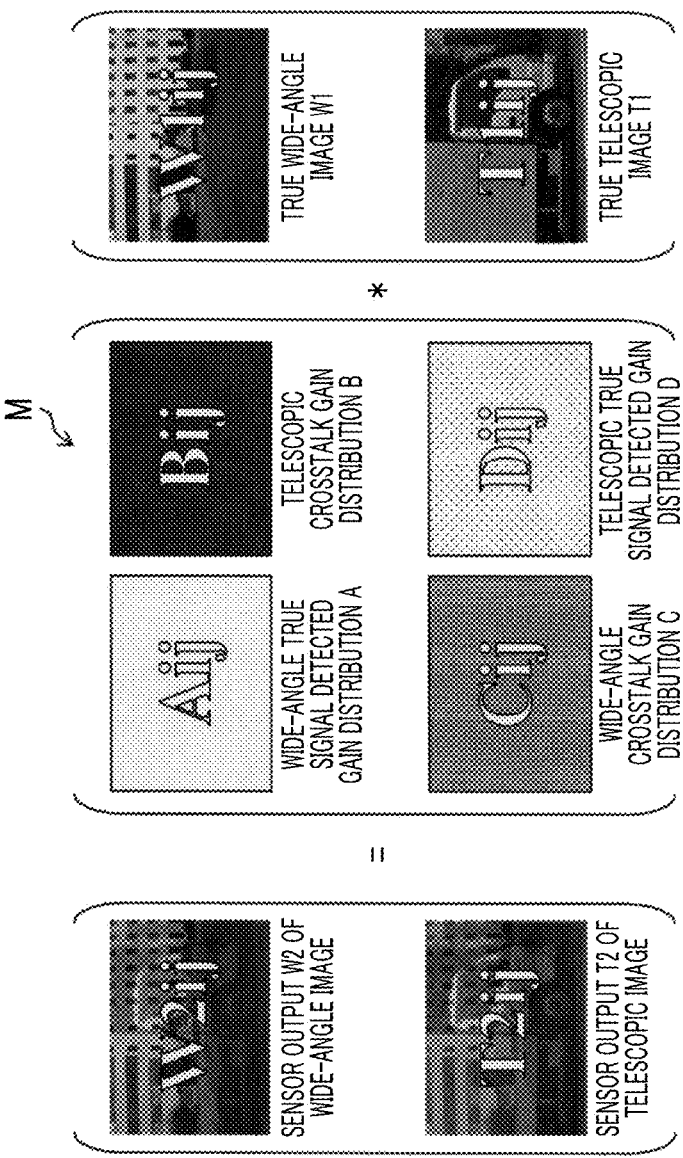
FIG. 9 is a diagram illustrating a relationship among a true wide-angle image, a true telescopic image, a first crosstalk image, a second crosstalk image, and a matrix configured of a detected gain distribution and a crosstalk gain distribution.

FIG. 9 is a diagram illustrating a relationship among the true wide-angle image W1 ($W1_{ij}$), the true telescopic image T1 ($T1_{ij}$), the sensor output W2 ($W2_{ij}$), the sensor output T2 ($T2_{ij}$), and a matrix M configured of a detected gain distribution and a crosstalk gain distribution. The subscripts i and j indicate a pixel position on a two-dimensional image.

As illustrated in FIG. 9, the sensor output W2 and the sensor output T2 that are output from the image sensor 24 (the first light receiving element 25A and the second light receiving element 25B) are represented by the product of "the matrix M configured of a detected gain distribution A ($A_{ij}$) of a wide-angle true signal, a detected gain distribution D ($D_{ij}$) of a telescopic true signal, a crosstalk gain distribution B ($B_{ij}$) of the telescopic image with respect to the wide-angle image, and a crosstalk gain distribution C ($C_{ij}$) of the wide-angle image with respect to the telescopic image" and "the true wide-angle image W1 and the true telescopic image T1 generated with only the wide-angle image W and only the telescopic image T respectively passing the first optical system 21 and the second optical system 22".

The matrix M configured of the detected gain distributions A and D and the crosstalk gain distributions B and C is a 2×2 matrix as illustrated in FIG. 9.

An ideal image sensor has the detected gain distributions A and D of 1 and the crosstalk gain distributions B and C of 0. In the case of the ideal image sensor, the sensor output W2 matches the true wide-angle image W1, and the sensor output T2 matches the true telescopic image T1.

However, even with the image sensor 24 (an image sensor not having an ideal property), if an inverse matrix $M^{-1}$ of the matrix M exists, a crosstalk component can be removed from the sensor output W2 (first crosstalk image) and the sensor output T2 (second crosstalk image) acquired from the image sensor 24, and the true wide-angle image W1 (first image) and the true telescopic image T1 (second image) can be acquired.

Even in the case of the sensor output T2 including equal components of the wide-angle image and the telescopic image such as C=0.5 and D=0.5 (that is, in the case of the second light receiving element 25B not having an ability to separate the wide-angle image and the telescopic image), if A≠B is established, AD−BC≠0 (a condition for existence of the inverse matrix $M^{-1}$ of the matrix M) is satisfied, and a crosstalk component can be removed from the sensor output W2 and the sensor output T2.

Figure 10:
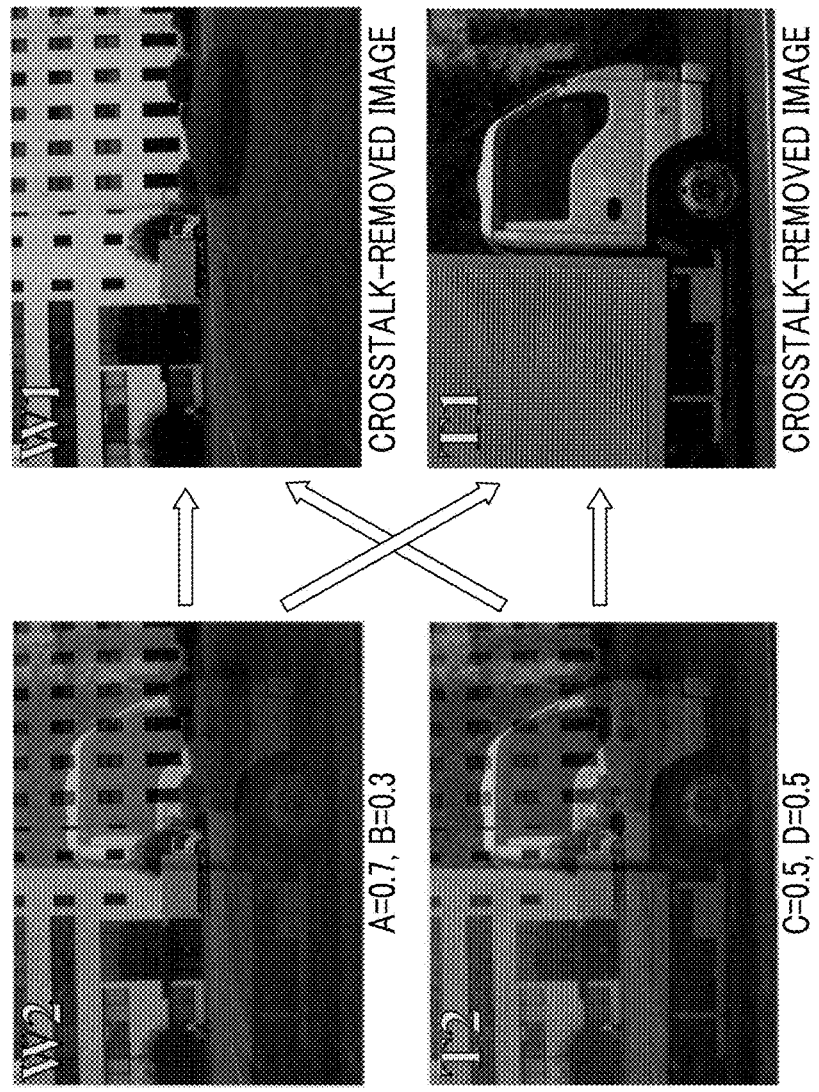
FIG. 10 is a conceptual diagram illustrating a method for calculating crosstalk-removed images (the true wide-angle image and the true telescopic image) from the first crosstalk image and the second crosstalk image acquired from the image sensor.

FIG. 10 is a conceptual diagram illustrating a method for calculating crosstalk-removed images (the true wide-angle image W1 and the true telescopic image T1) from the sensor output W2 and the sensor output T2 acquired from the image sensor 24.

The true wide-angle image W1 and the true telescopic image T1 can be calculated by Expression (1) illustrated in FIG. 12 on the basis of the sensor output W2, the sensor output T2, and the inverse matrix $M^{-1}$ of the matrix M illustrated in FIG. 9.

In Expression (1), A, B, C, and D constituting the inverse matrix $M^{-1}$ are the detected gain distribution A of the wide-angle true signal, the crosstalk gain distribution B of the telescopic image with respect to the wide-angle image, the crosstalk gain distribution C of the wide-angle image with respect to the telescopic image, and the detected gain distribution D of the telescopic true signal. In the example illustrated in FIG. 10, the case of A=0.7, B=0.3, C=0.5, and D=0.5 is illustrated.

(A1) to (C2) of FIG. 11 are diagrams illustrating a simulation result of acquiring the sensor output W2 (first crosstalk image) and the sensor output T2 (second crosstalk image) with use of the image sensor 24 of the present embodiment and acquiring the crosstalk-removed images (the true wide-angle image W1 and the true telescopic image T1) by the crosstalk removal method.

The size and the like of each unit of the image sensor 24 of the present embodiment are as follows.

Radius of curvature of first microlens 29A: 3.7 μm

Radius of curvature of second microlens 29B: 5.0 μM

Refractive index of first microlens 29A and second microlens 29B: 1.55

Distance between vertex of first microlens 29A and incident surface of first photodiode 26A: 9.1 μm Distance between vertex of second microlens 29B and incident surface of second photodiode 26B: 9.1 μm Width (pixel pitch) between first light receiving element 25A and second light receiving element 25B: 7 μm Opening size/pixel pitch of first photodiode 26A of first light receiving element 25A: 32%

Opening size/pixel pitch of second photodiode 26B of second light receiving element 25B: 32%

(A1) and (A2) of FIG. 11 illustrate a relationship between a pupil image of the multiple-property lens 11 formed by the first microlens 29A of the first light receiving element 25A and the second microlens 29B of the second light receiving element 25B and each openings O of the first photodiode 26A of the first light receiving element 25A and the second photodiode 26B of the second light receiving element 25B.

The pupil image of the multiple-property lens 11 formed by the first microlens 29A of the first light receiving element 25A is focused as illustrated in (A1) of FIG. 11, and the pupil image of the multiple-property lens 11 formed by the second microlens 29B of the second light receiving element 25B is out of focus as illustrated in the (A2) of FIG. 11. The pupil image illustrated in (A2) of FIG. 11 is blur and large as compared with the pupil image illustrated in (A2) of FIG. 11.

The detected gain distribution A of the wide-angle true signal of the sensor output W2 acquired from the first light receiving element 25A is A=0.4029, and the crosstalk gain distribution B of the telescopic image with respect to the wide-angle image is B=0.0654. The crosstalk gain distribution C of the wide-angle image with respect to the telescopic image of the sensor output T2 acquired from the second light receiving element 25B is C=0.3705, and the detected gain distribution D of the telescopic image true signal is D=0.1612.

(B1) and (B2) of FIG. 11 respectively illustrate the sensor output W2 (first crosstalk image) and the sensor output T2 (second crosstalk image). As illustrated in the same drawings, due to different focusing degrees of the pupil images of the multiple-property lens 11 of the first photodiode 26A of the first light receiving element 25A and the second photodiode 26B of the second light receiving element 25B, the first crosstalk image and the second crosstalk image have different crosstalk ratio of the telescopic image T to the wide-angle image W.

(C1) and (C2) of FIG. 11 respectively illustrate the true wide-angle image W1 and the true telescopic image T1 from which crosstalk is removed.

The true wide-angle image W1 and the true wide-angle image T1 can be calculated by Expression (1) illustrated in FIG. 12 on the basis of the inverse matrix $M^{-1}$ of the matrix configured of the detected gain distribution and the crosstalk gain distribution of each of the sensor output W2 and the sensor output T2, the sensor output W2, and the sensor output T2.

FIG. 13 illustrates elements w1_11 to w1_$mn$ constituting "W1" in Expression (1) illustrated in FIG. 12. That is, "W1" is configured of the elements w1_11 to w1_$mn$ that correspond to pixel components (pixel values) of the true wide-angle image W1.

Similarly, "W2", "T1", and "T2" illustrated in FIG. 12 are respectively configured of elements w2_11 to w2_$mn$, t1_11 to t1_$mn$, and t2_11 to t2_$mn$ that correspond to pixel components (pixel values) of the sensor output W2, the true telescopic image T1, and the sensor output T2 (not illustrated).

While the gain distributions A to D constituting the inverse matrix $M^{-1}$ in Expression (1) illustrated in FIG. 12 are A=0.4029, B=0.0654, C=0.3705, and D=0.1612 in the simulation result illustrated in (A1) and (C2) of FIG. 11, the gain distributions A to D, in the strict sense, are different for each location in the image sensor 24. Thus, true images are preferably obtained by using matrices or inverse matrices (exist in number corresponding to the number of pixels) at each location. That is, the gain distributions A to D constituting the inverse matrix $M^{-1}$ are preferably respectively configured of elements a11 to amn, b11 to bmn, c11 to cmn, and d11 to dmn that are determined according to each pixel of the wide-angle image and the telescopic image (not illustrated).

FIG. 14 illustrates Expression (2) that calculates an element "w1_$ij$" corresponding to a pixel component (pixel value) constituting the true wide-angle image W1 derived on the basis of Expression (1) illustrated in FIG. 12. Similarly, FIG. 15 illustrates Expression (3) that calculates an element "t1_$ij$" corresponding to a pixel component (pixel value) constituting the true telescopic image T1 derived on the basis of Expression (1) illustrated in FIG. 12.

<Internal Configuration of Imaging Device>

FIG. 16 is a block diagram illustrating an internal configuration of a main portion of the imaging device 30 illustrated in FIG. 1 and FIG. 2.

The imaging device 30 illustrated in FIG. 16 includes an image acquiring unit 32, a crosstalk removal processing unit 34, a digital signal processing unit 36, and the like in addition to the multiple-property lens 11 and the image sensor 24 mainly described above. The image acquiring unit 32, the crosstalk removal processing unit 34, the digital signal processing unit 36, and the like are realized by, for example, one or a plurality of microprocessors in the digital camera illustrated in FIG. 1 or a smartphone illustrated in FIG. 20.

The wide-angle image and the telescopic image imaged by the first optical system 21 and the second optical system 22 of the multiple-property lens 11 are formed on the light receiving surface of the image sensor 24 and are converted by each of the photodiodes 26A and 26B into signal voltages (or charges) that have an amount of charges corresponding to the intensity of incident light.

The signal voltages (or charges) accumulated in the image sensor 24 are stored in each light receiving element 25 or a capacitor that is additionally disposed. The stored signal voltages (or charges) are read along with selection of the position of the light receiving element 25 by using a method of a metal oxide semiconductor (MOS) image sensor (a so-called complementary metal oxide semiconductor (CMOS) sensor) that uses X-Y addressing.

Accordingly, an image signal (sensor output W2) that indicates the first crosstalk image can be read from the plurality of first light receiving elements 25A included in the image sensor 24, and an image signal (sensor output T2) that indicates the second crosstalk image can be read from the plurality of second light receiving elements 25B included in the image sensor 24.

The image signal (voltage signal) read from the image sensor 24 for each light receiving element is sampled and held by two correlation pile sampling processing (a process of acquiring accurate pixel data by obtaining the difference between a feedthrough component level and a signal component level included in output signals for each light receiving element, with the purpose of reducing noise (particularly, thermal noise) included in the sensor output), is amplified, and then is put into an analog-to-digital (A/D) converter 20. The A/D converter 20 converts, to a digital signal, an image signal that is input in order, and outputs the digital signal to the image acquiring unit 32. Some MOS image sensor incorporates an A/D converter. In this case, the digital signal is directly output from the image sensor 24.

The image acquiring unit 32 can acquire an image signal indicating the first crosstalk image and an image signal indicating the second crosstalk image that are imaged at the same time, by selecting the position of the light receiving element of the image sensor 24 and reading an image signal.

That is, an image signal that indicates the first crosstalk image can be acquired by selecting the plurality of first light receiving elements 25A of the image sensor 24 and selectively reading an image signal from the plurality of first light receiving elements 25A, and an image signal that indicates the second crosstalk image can be acquired by selecting the plurality of second light receiving elements 25B of the image sensor 24 and selectively reading an image signal from the plurality of second light receiving elements 25B.

All image signals may be read from the image sensor 24 and temporarily stored in a buffer memory, and the image signals stored in the buffer memory may be grouped into image signals of two images of the first crosstalk image and the second crosstalk image.

The image signals that indicate the first crosstalk image and the second crosstalk image and are acquired by the image acquiring unit 32 are output to the crosstalk removal processing unit 34.

The crosstalk removal processing unit 34 is a part that removes a crosstalk component from the image signals which are input from the image acquiring unit 32 and indicate the first crosstalk image and the second crosstalk image, to generate image signals indicating the first image (wide-angle image) and the second image (telescopic image) respectively having the first property (wide-angle) of the first optical system of the multiple-property lens 11 and the second property (telescopic) of the second optical system 22. The crosstalk removal processing unit 34 generates image signals indicating the wide-angle image and the telescopic image without crosstalk on the basis of Expression (1) illustrated in FIG. 12.

That is, the crosstalk removal processing unit 34 has a storage unit 34A such as a read only memory (ROM) storing the gain distributions A to D constituting the inverse matrix $M^{-1}$ illustrated in Expression (1) and generates image signals indicating the wide-angle image W1 and the telescopic image T1 without crosstalk by multiplying the inverse matrix $M^{-1}$ stored in the storage unit 34A by the image signals (sensor outputs W2 and T2) that are input from the image acquiring unit 32 and indicate the first crosstalk image and the second crosstalk image. The gain distributions A to D constituting the inverse matrix $M^{-1}$ can be uniquely specified by the properties of the multiple-property lens 11 and the image sensor 24 and thus can be calculated in advance and stored in the storage unit 34A.

The image signals that are generated by the crosstalk removal processing unit 34 and indicate the wide-angle image W1 and the telescopic image T1 without crosstalk are output to the digital signal processing unit 36.

The digital signal processing unit 36 performs predetermined signal processing such as offset processing or gamma correction processing for the input digital image signals.

The image signals that are processed in the digital signal processing unit 36 and indicate the wide-angle image and the telescopic image are output to a recording unit 38 and a display unit 40. The recording unit 38 records, in a recording medium (a hard disk, a memory card, or the like), the image signals for still picture recording or motion picture recording that are processed by the digital signal processing unit 36 and indicate the wide-angle image and the telescopic image.

The display unit 40 displays a wide-angle image and a telescopic image from the image signals for still picture display or motion picture display that are processed by the digital signal processing unit 36 and indicate the wide-angle image and the telescopic image. The display unit 40 can also play back the wide-angle image and the telescopic image on the basis of the image signals recorded in the recording unit 38.

Second Embodiment

FIG. 17 is a diagram for describing an imaging mechanism that uses the multiple-property lens 11 according to a second embodiment.

The multiple-property lens 11 illustrated in FIG. 17 consists of the circular first optical system 21 and the annular second optical system 22 that is concentrically arranged with respect to the first optical system 21. The first optical system 21 and the second optical system have a common optical axis and have different focal distances.

In FIG. 17, contents indicated by each reference sign are as follows.

a1: lens—light receiving surface distance of first optical system 21 (far focal area 60*a*)

a2: lens—light receiving surface distance of second optical system 22 (near focal area 60*b*)

b1: lens-subject distance of first optical system 21 (far focal area 60*a*)

b2: lens-subject distance of second optical system 22 (near focal area 60*b*)

FD1: focal distance of first optical system 21 (far focal area 60*a*)

FD2: focal distance of second optical system 22 (near focal area 60*b*)

Q1A, Q1B, and Q2: subjects

In the present embodiment, the "focal distance" indicates the distance from the light receiving surface of the light receiving element 25 of the image sensor 24 to a subject that is in a focused relationship with the light receiving element 25. In the example illustrated in FIG. 17, the relationships "FD1=a1+b1" and "FD2=a2+b2" are established. In addition, given that the focal length of the first optical system 21 (far focal area 60*a*) is "f1" and that the focal length of the second optical system 22 (near focal area 60*b*) is "f2", the relationships "1/f1=(1/a1)+(1/b1)" and "1/f2=(1/a2)+(1/b2)" are established.

Even in the imaging device 30 that includes "the first optical system 21 and the second optical system 22 having different focal distances", the first image that is focused on the long range subjects Q1A and Q1B by the first optical system 21 and the second image that is focused on the short range subject Q2 by the second optical system 22 can be imaged at the same time by the same functional configuration as the first embodiment (refer to FIG. 16).

That is, crosstalk occurs between light of a first focused image that is focused on the long range subjects Q1A and Q1B by the first optical system 21 and light of a second focused image that is focused on the short range subject Q2 by the second optical system 22, and the light of the first focused image and the light of the second focused image are incident on the first light receiving element 25A and the second light receiving element 25B of the image sensor 24.

Accordingly, the first crosstalk image in which crosstalk occurs between the first focused image and the second focused image can be acquired from the first light receiving element 25A of the image sensor 24, and the second crosstalk image that has a different crosstalk ratio from the first light receiving element 25A and has crosstalk occurring between the first focused image and the second focused image can be acquired from the second light receiving element 25B of the image sensor 24.

The crosstalk removal processing unit 34 can generate the first image focused to the long range subjects Q1A and Q1B and the second image focused to the short range subject Q2 without crosstalk by multiplying the inverse matrix $M^{-1}$ ($M^{-1}$ in Expression (1) illustrated in FIG. 12) by the first crosstalk image and the second crosstalk image acquired from the image sensor 24.

The multiple-property lens 11 according to the second embodiment has a different property from the multiple-property lens 11 illustrated in FIG. 3 and the like. Thus, apparently, the gain distributions A to D constituting the inverse matrix $M^{-1}$ are also different.

Third Embodiment

FIG. 18 is a graph illustrating modulation transfer functions (MTF) of a first optical system and a second optical system of a multiple-property lens according to a third embodiment (not illustrated).

The first optical system and the second optical system of the multiple-property lens according to the third embodiment have the same focal length and the same focal distance but have different MTFs. The first optical system has a first MTF illustrated by an MTF curve a in FIG. 18, and the second optical system has a second MTF illustrated by an MTF curve b in FIG. 18. The multiple-property lens according to the third embodiment, for example, can have almost the same exterior shape as the multiple-property lens 11 illustrated in FIG. 17.

According to the MTF curve a illustrated in FIG. 18, the first optical system having the first MTF is an optical system having high resolution and low contrast compared with the second optical system having the second MTF. According to the MTF curve b illustrated in FIG. 18, the second optical system having the second MTF is an optical system having low resolution and high contrast compared with the first optical system having the first MTF.

Even in the imaging device 30 that includes "the first optical system and the second optical system having different MTFs", a first image and a second image that correspond to the respective MTFs of the first optical system and the second optical system can be imaged at the same time by the same functional configuration as the first embodiment (refer to FIG. 16).

That is, crosstalk occurs between light of a first image corresponding to the first MTF of the first optical system and light of a second image corresponding to the second MTF of the second optical system, and the light of the first image and the light of the second image are incident on the first light receiving element 25A and the second light receiving element 25B of the image sensor 24.

Accordingly, the first crosstalk image in which crosstalk occurs between the first image and the second image can be acquired from the first light receiving element 25A of the image sensor 24, and the second crosstalk image that has a different crosstalk ratio from the first light receiving element 25A and has crosstalk occurring between the first image and the second image can be acquired from the second light receiving element 25B of the image sensor 24.

The crosstalk removal processing unit 34 can generate the first image having the first MTF and the second image having the second MTF without crosstalk by multiplying the inverse matrix $M^{-1}$ ($M^{-1}$ in Expression (1) illustrated in FIG. 12) by the first crosstalk image and the second crosstalk image acquired from the image sensor 24.

<Another Embodiment of Image Sensor>

FIG. 19 is a cross-sectional view illustrating another embodiment of the image sensor applied to the present invention and is a cross-sectional view with a main portion of the image sensor enlarged.

An image sensor 124 illustrated in FIG. 19 is a rear surface irradiation image sensor in which an interconnect layer 127 where an interconnect or the like for reading an image signal corresponding to charges accumulated in the first photodiode 126A and the second photodiode 126B is formed is disposed on the opposite side from light receiving surfaces (rear surfaces) of the first photodiode 126A and the second photodiode 126B. A layer 128 such as an antireflection layer, a leveling layer, or a color filter is disposed on the light receiving surfaces (surfaces) of the first photodiode 126A and the second photodiode 126B. On the incident surface side of the layer 128, a first microlens 129A and a second microlens 129B (on-chip microlens) are formed, and a first light receiving element 125A and a second light receiving element 125B are formed.

The first microlens 129A and the second microlens 129B are respectively disposed in each first light receiving element 125A and each second light receiving element 125B. The first microlens 129A and the second microlens 129B form, on the light receiving surfaces of the first photodiode 126A and the second photodiode 126B, images of light of a wide-angle image and light of a telescopic image (a pupil image of the multiple-property lens 11) incident on the first microlens 129A and the second microlens 129B at different focusing degrees. The first microlens 129A and the second microlens 129B have different radius of curvatures similarly to the first microlens 29A and the second microlens 29B of the image sensor 24 illustrated in FIG. 4.

The image sensor 124 according to this embodiment is a rear surface irradiation image sensor, and thus there is no interconnect layer on the light receiving surface (surface) side of the first photodiode 126A and the second photodiode 126B. Consequently, not only an advantage of making a pixel size very small but also an advantage of high sensitivity due to high efficiency of use of light are achieved compared with the image sensor 24 according to the first embodiment illustrated in FIG. 4 (that is, the surface irradiation image sensor in which the interconnect layer 27 is formed on the light receiving surface (surface) side of the first photodiode 26A and the second photodiode 26B).

<Still Another Embodiment of Image Sensor>

FIG. 20 is a cross-sectional view of an image sensor of still another present embodiment applied to the present invention and is a cross-sectional view with a main portion of the image sensor enlarged. Common portions to the image sensor 24 illustrated in FIG. 4 are represented by the same reference numerals and detailed description thereof will not be repeated.

An image sensor 224 illustrated in FIG. 20 has different configuration of a microlens from the image sensor 24 illustrated in FIG. 4. The microlens 29A is disposed in a first light receiving element 225A on an incident surface side of a leveling layer 28A, and no microlens is disposed in a second light receiving element 225B on an incident surface side of a leveling layer 28B.

The plurality of light receiving elements 225 constituting the image sensor 224 of the present example includes the first light receiving element 225A having the microlens 29A and the second light receiving element 225B not having the microlens being alternately two-dimensionally arranged.

The microlens 29A disposed in the first light receiving element 225A is the same microlens as the first microlens 29A of the image sensor 24 illustrated in FIG. 4. The first light receiving element 225A has substantially the same configuration as the first light receiving element 25A illustrated in FIG. 4.

A pupil image of the multiple-property lens 11 is formed to be focused on a light receiving surface of the first light receiving element 225A by the microlens 29A.

Since a microlens is not disposed in the second light receiving element 225B, there is no image forming and converging by the luminous flux of the wide-angle image W and the luminous flux of the telescopic image T which are incident on the second light receiving element 225B. The luminous flux of the wide-angle image W and the luminous flux of the telescopic image T reach the light receiving surface of the second light receiving element 225B as in a substantially parallel light manner.

While focused light of the wide-angle image and light of the telescopic image (a pupil image of the multiple-property lens 11) are incident on the light receiving surface of the first photodiode 26A of the first light receiving element 225A by the microlens 29A, unfocused pupil image of the multiple-property lens 11 is incident on the second photodiode 26B of the second light receiving element 225B. Therefore, the first light receiving element 225A and the second light receiving element 225B have different focusing degree of the pupil images of the multiple-property lens 11 on the light receiving surfaces and thus have different light reception sensitivity properties.

Sensor outputs indicating the first crosstalk image and the second crosstalk image having different crosstalk ratios of the wide-angle image W and the telescopic image T according to the difference in focusing degree as above can be acquired from the plurality of first light receiving elements 225A and the plurality of second light receiving elements 225B included in the image sensor 224 in the present example.

Other Modification Examples

The present invention is not limited to the above embodiments, and various modifications can be carried out to the extent not departing from the spirit of the present invention.

For example, the above embodiments may be appropriately combined, and the present invention can also be applied to a multiple-property lens that has a combination of two or more of each property of the multiple-property lens according to the first embodiment, the multiple-property lens according to the second embodiment, and the multiple-property lens according to the third embodiment.

While the example of configuring the multiple-property lens 11 of two types of optical systems (the first optical system 21 and the second optical system 22) is described in the above embodiments, the multiple-property lens 11 may be configured of three or more types of optical systems.

While the image sensor 24 of the present embodiment is configured by arranging the first light receiving element 25A and the second light receiving element 25B in panes (checker pattern), the image sensor according to the present invention is not limited thereto and includes an image sensor in which a first light receiving element and a second light receiving element having different focusing degrees according to the microlens form a pair in adjacency to each other with the pair two-dimensionally arranged, an image sensor that has the ratio in numbers of first light receiving elements and second light receiving elements not equal to 1:1 and has the number of first light receiving elements greater than the number of second light receiving elements, an image sensor that, conversely, has the number of first light receiving elements smaller than the number of second light receiving elements, and the like. In the case of a difference between the number of first light receiving elements and the number of second light receiving elements, sensor outputs of the light receiving elements in small numbers are preferably interpolated to have the same image size as sensor outputs of the light receiving elements in large numbers in order to be capable of calculating Expression (1) illustrated in FIG. 12.

While in the present embodiment, the first microlens of the first light receiving element and the second microlens of the second light receiving element have different radius of curvatures and thus focusing degrees of pupil images of the multiple-property lens formed on each light receiving surface of the first light receiving element and the second light receiving element are different, the present invention is not limited to the above. The first microlens and the second microlens having the same radius of curvature may be used and the first micro lens and the second microlens may have different distances between the vertex of the first microlens and the first photodiode, and between the vertex of the second microlens and the second photodiode so as to have different focusing degrees of pupil images of the multiple-property lens in the first light receiving element and the second light receiving element.

Furthermore, the present invention can be applied to an imaging method that includes a step of acquiring a first crosstalk image from a plurality of first light receiving elements of an image sensor and acquiring a second crosstalk image from a plurality of second light receiving elements thereof and a step of removing a crosstalk component from each of the first crosstalk image and the second crosstalk image acquired to generate a first image and a second image respectively having a first property and a second property of a multiple-property lens.

Furthermore, each configuration and each function above can be appropriately realized by any hardware, software, or a combination thereof. The present invention can also be applied to, for example, an image processing program that inputs the first crosstalk image and the second crosstalk image into a computer directly from the imaging device including the multiple-property lens 11 and the image sensor 24 (FIG. 3) or indirectly through a recording medium or the like and causes the computer to execute the above steps, a computer-readable recording medium (non-transitory recording medium) in which the image processing program is recorded, or a computer on which the image processing program can be installed.

Embodiments to which the present invention can be applied are not limited to the digital camera 10 illustrated in FIG. 1 and the automatic tracking imaging device 14 illustrated in FIG. 2. The present invention can also be applied to, in addition to a camera type performing imaging as a main function, a mobile apparatus type that includes another function (a calling function, a communication function, or another computer function) other than imaging in addition to an imaging function. Another embodiment to which the present invention can be applied is exemplified by, for example, a mobile phone or a smartphone having a camera function, personal digital assistants (PDA), and a mobile game apparatus. Hereinafter, one example a smartphone to which the present invention can be applied will be described.

<Configuration of Smartphone>

FIG. 21 is a diagram illustrating the exterior of a smartphone 101 that is one embodiment of the imaging device of the present invention. The smartphone 101 illustrated in FIG. 21 has a plate-shaped casing 102. A display input unit 120 in which a display panel 121 as a display unit and an operating panel 122 as an input unit are integrally formed is disposed on one surface of the casing 102. In addition, the casing 102 includes a speaker 131, a microphone 132, an operating unit 140, and a camera unit 141. The configuration of the casing 102 is not limited thereto and, for example, can employ a configuration in which a display unit and an input unit are independently disposed or employ a configuration that has a folding structure or a sliding mechanism.

FIG. 22 is a block diagram illustrating a configuration of the smartphone 101 illustrated in FIG. 21. As illustrated in FIG. 22, a wireless communication unit 110, the display input unit 120, a calling unit 130, the operating unit 140, the camera unit 141, a storage unit 150, an external input and output unit 160, a global positioning system (GPS) receiving unit 170, a motion sensor unit 180, a power supply unit 190, and a main control unit 100 are included as main constituents of the smartphone 101. In addition, a wireless communication function that performs mobile wireless communication through a base station apparatus and a mobile communication network is included as a main function of the smartphone 101.

The wireless communication unit 110 performs wireless communication with the base station apparatus connected to the mobile communication network in accordance with an instruction from the main control unit 100. With use of the wireless communication, transmission and reception of various types of file data such as audio data and image data, electronic mail data, and the like and reception of Web data, streaming data, and the like are performed.

The display input unit 120 is a so-called touch panel including the display panel 121 and the operating panel 122 and, by control of the main control unit 100, visually delivers information to the user by displaying an image (a still image and a moving image), character information, or the like, and detects a user operation for the displayed information.

The display panel 121 uses a liquid crystal display (LCD), an organic electro-luminescence display (OELD), or the like as a display device. The operating panel 122 is a device that is disposed in a state where an image displayed on a display surface of the display panel 121 is visible and that detects one or a plurality of coordinates operated with a finger of the user or a stylus. If the device is operated with a finger of the user or the stylus, the operating panel 122 outputs a detected signal generated by the operation to the main control unit 100. Next, the main control unit 100 detects the position of the operation (coordinates) on the display panel 121 on the basis of the received detected signal.

The display panel 121 and the operating panel 122 of the smartphone 101 illustrated in FIG. 21 as one embodiment of the imaging device of the present invention integrally constitute the display input unit 120, and the operating panel 122 is arranged to completely cover the display panel 121. In the case of employing the arrangement, the operating panel 122 may include a function of detecting a user operation even in an area outside of the display panel 121. In other words, the operating panel 122 may include a detection area (hereinafter, referred to as a "display area") for an overlaying part thereof that overlays the display panel 121 and a detection area (hereinafter referred to as a "non-display area") for a peripheral part thereof other than the overlaying part that does not overlay the display panel 121.

The size of the display area may completely match the size of the display panel 121, but both sizes may not necessarily match. In addition, the operating panel 122 may include two responsive areas of a peripheral part thereof and an inner part thereof other than the peripheral part. Furthermore, the width of the peripheral part is appropriately designed according to the size or the like of the casing 102. Furthermore, a position detection method employed in the operating panel 122 is exemplified by a matrix switch method, a resistive film method, a surface acoustic wave method, an infrared method, an electromagnetic induction method, an electrostatic capacitive method, or the like, and any method may be employed.

The calling unit 130 includes the speaker 131 and the microphone 132. The calling unit 130 converts the voice of the user input through the microphone 132 into audio data processable in the main control unit 100 and outputs the audio data to the main control unit 100, or decodes audio data received by the wireless communication unit 110 or the external input and output unit 160 and causes the decoded audio data to be output from the speaker 131. As illustrated in FIG. 21, for example, the speaker 131 and the microphone 132 can be mounted on the same surface as the surface on which the display input unit 120 is disposed.

The operating unit 140 is a hardware key in which a key switch or the like is used, and receives an instruction from the user. For example, as illustrated in FIG. 21, the operating unit 140 is a push-button switch that is mounted on a side surface of the casing 102 of the smartphone 101, is placed into a switch ON state if being pushed with a finger or the like, and is placed into a switch OFF state by a restoring force of a spring or the like if the finger is separated.

The storage unit 150 stores a control program and control data of the main control unit 100, application software, address data in which a name, a telephone number, and the like of a communication party are associated, data of a transmitted or received electronic mail, Web data downloaded by Web browsing, downloaded contents data, and the like and temporarily stores streaming data and the like. In addition, the storage unit 150 is configured of a smartphone-incorporated internal storage unit 151 and an external storage unit 152 having a slot for a detachable external memory. Each of the internal storage unit 151 and the external storage unit 152 constituting the storage unit 150 is realized by using a storage medium such as a memory of a flash memory type, a hard disk type, a multimedia card micro type, or a card type (for example, a MicroSD (registered trademark) memory), a random access memory (RAM), a read only memory (ROM), or the like.

The external input and output unit 160 acts as an interface with all external apparatuses connected to the smartphone 101 and is directly or indirectly connected to another external apparatus by communication or the like (for example, Universal Serial Bus (USB) or IEEE1394) or a network (for example, the Internet, a wireless LAN, Bluetooth (registered trademark), radio frequency identification (RFID), Infrared Data Association (IrDA), Ultra Wideband (UWB) (registered trademark), or ZigBee (registered trademark)).

Examples of the external apparatuses connected to the smartphone 101 include a wired/wireless headset, a wired/wireless external changer, a wired/wireless data port, a memory card or a subscriber identity module (SIM)/user identity module (UIM) card connected through a card socket, an external audio and video apparatus connected through an audio and video input/output (I/O) terminal, a wirelessly connected external audio and video apparatus, a smartphone connected in a wired/wireless manner, a personal computer connected in a wired/wireless manner, a PDA connected in a wired/wireless manner, and an earphone. The external input and output unit 160 may be configured to deliver data transferred from such an external apparatus to each constituent in the smartphone 101 or to transfer data in the smartphone 101 to an external apparatus.

The GPS receiving unit 170, in accordance with an instruction from the main control unit 100, receives a GPS signal transmitted from GPS satellites ST1, ST2, . . . , STn, executes position measurement calculation processing based on a plurality of received GPS signals, and detects a position specified by the latitude, the longitude, and the altitude of the smartphone 101. The GPS receiving unit 170, in the case of being capable of acquiring positional information from the wireless communication unit 110 and/or the external input and output unit 160 (for example, a wireless LAN), can detect the position by using the positional information.

The motion sensor unit 180 includes, for example, a three-axis acceleration sensor and detects a physical motion of the smartphone 101 in accordance with an instruction from the main control unit 100. Detection of a physical motion of the smartphone 101 allows the moving direction or the acceleration of the smartphone 101 to be detected. The result of the detection is output to the main control unit 100.

The power supply unit 190 supplies power stored in a battery (not illustrated) to each unit of the smartphone 101 in accordance with an instruction from the main control unit 100.

The main control unit 100 includes a microprocessor, operates in accordance with the control program and the control data stored in the storage unit 150, and generally controls each unit of the smartphone 101. In addition, the main control unit 100 includes a mobile communication control function of controlling each unit of a communication system and an application processing function in order to perform audio communication and data communication through the wireless communication unit 110.

The application processing function is realized by the main control unit 100 operating in accordance with the application software stored in the storage unit 150. Examples of the application processing function include an infrared communication function that performs data communication with a counterpart apparatus by controlling the external input and output unit 160, an electronic mailing function of transmitting or receiving an electronic mail, and a Web browsing function of browsing a Web page.

In addition, the main control unit 100 includes an image processing function such as displaying a video on the display input unit 120 on the basis of image data (data of a still image or a moving image) such as received data, downloaded streaming data, or the like. The image processing function refers to a function of the main control unit 100 that decodes the image data, performs image processing for the decoding result, and displays an image acquired through the image processing on the display input unit 120.

The main control unit 100 executes a display control for the display panel 121 and an operation detection control of detecting a user operation performed through the operating unit 140 or the operating panel 122.

The main control unit 100, by executing the display control, displays an icon for launching the application software or a software key such as a scroll bar or displays a window for writing an electronic mail. The scroll bar refers to a software key for receiving an instruction to move a displayed part of an image for a large image or the like that does not fit in the display area of the display panel 121.

The main control unit 100, by executing the operation detection control, detects a user operation performed through the operating unit 140, receives an operation performed for the icon or an input of a character string in an input field of the window through the operating panel 122, or receives a scroll request for a displayed image through the scroll bar.

Furthermore, the main control unit 100 includes a touch panel control function that, by execution of the operation detection control, determines whether the position of an operation performed for the operating panel 122 corresponds to the overlaying part (display area) overlaying the display panel 121 or corresponds to the peripheral part (non-display area) other than the overlaying part not overlaying the display panel 121 and that controls the displayed position of the responsive area of the operating panel 122 or the software key.

In addition, the main control unit 100 can detect a gesture operation performed for the operating panel 122 and execute a preset function in response to the detected gesture operation. The gesture operation is not a simple touch operation in the related art and means an operation of drawing a trajectory with a finger or the like, specifying a plurality of positions at the same time, or, as a combination thereof, drawing a trajectory from at least one of a plurality of positions.

The imaging device 30 described above can be applied for the camera unit 141. The camera unit 141, by control of the main control unit 100, can convert image data acquired by imaging into compressed image data such as Joint Photographic Experts Group (JPEG) and record the image data in the storage unit 150 or output the image data through the external input and output unit 160 or the wireless communication unit 110. While the camera unit 141 is mounted on the same surface as the display input unit 120 in the smartphone 101 as illustrated in FIG. 21, the position of mounting of the camera unit 141 is not limited thereto. The camera unit 141 may be mounted on the rear surface of the casing 102 and not on the surface of the casing 102 on which the display input unit 120 is mounted, or a plurality of the camera units 141 may be mounted on the casing 102. In the case of mounting a plurality of the camera units 141, imaging may be performed with one camera unit 141 by switching the camera unit 141 to be used in imaging, or imaging may be performed by using the plurality of camera units 141 at the same time.

In addition, the camera unit 141 can be used in various functions of the smartphone 101. For example, an image acquired in the camera unit 141 may be displayed on the display panel 121, or an image that is imaged and acquired in the camera unit 141 may be used as one of operation input methods for the operating panel 122. In addition, when the GPS receiving unit 170 detects a position, the position may be detected by referencing the image from the camera unit 141. Furthermore, determination of the direction of the optical axis of the camera unit 141 of the smartphone 101 or determination of the current usage environment can be performed by referencing the image from the camera unit 141 without using the three-axis acceleration sensor or with use of the three-axis acceleration sensor. Apparently, the image from the camera unit 141 can be used in the application software.

Besides, data that is acquired by adding positional information acquired by the GPS receiving unit 170, audio information acquired by the microphone 132 (may be converted into text information by audio text conversion by the main control unit or the like), attitude information acquired by the motion sensor unit 180, or the like to image data of a still picture or a motion picture can be recorded in the storage unit 150 or be output through the external input and output unit 160 or the wireless communication unit 110.

The image acquiring unit 32, the crosstalk removal processing unit 34, the digital signal processing unit 36, and the like (refer to FIG. 16) described above can be realized by, for example, the main control unit 100.

EXPLANATION OF REFERENCES 10 digital camera
11 multiple-property lens
14 automatic tracking imaging device
21 first optical system
22 second optical system
24, 124, 224 image sensor
25, 225 light receiving element
25A, 125A, 225A first light receiving element
25B, 125B, 225B second light receiving element
26A first photodiode
26B second photodiode
27, 127 interconnect layer
29A, 129A first microlens
29B, 129B second microlens
30 imaging device
32 image acquiring unit
34 crosstalk removal processing unit
36 digital signal processing unit
38 recording unit
40 display unit
100 main control unit
101 smartphone
141 camera unit

What is claimed is:

1. An imaging device comprising:
a multiple-property lens that includes a first area having a first property and a second area having a second property different from the first property;
an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged; and
a crosstalk removal processing unit that removes a crosstalk component from each of a first crosstalk image acquired from the first light receiving element of the image sensor and a second crosstalk image acquired from the second light receiving element to generate a first image and a second image respectively having the first property and the second property of the multiple-property lens.

2. The imaging device according to claim 1,
wherein the crosstalk removal processing unit calculates the first image and the second image on the basis of the first crosstalk image, the second crosstalk image, and an inverse matrix of a matrix configured of a detected gain distribution and a crosstalk gain distribution of each of the first crosstalk image and the second crosstalk image.

3. The imaging device according to claim 1,
wherein the first microlens and the second microlens are respectively disposed in each first light receiving element and each second light receiving element, and
wherein the first microlens forms, on a light receiving surface of the first light receiving element, a pupil image of the multiple-property lens at a first focusing degree, and the second microlens forms, on a light receiving surface of the second light receiving element, a pupil image of the multiple-property lens at a second focusing degree that is different from the first focusing degree.

4. The imaging device according to claim 1,
wherein the first microlens and the second microlens are different from each other in terms of at least one of a radius of curvature or a distance from the light receiving surface of the first light receiving element and from the light receiving surface of the second light receiving element.

5. The imaging device according to claim 1,
wherein the image sensor is a rear surface irradiation image sensor.

6. The imaging device according to claim 1,
wherein the multiple-property lens includes a first optical system corresponding to the first area having the first property and a second optical system corresponding to the second area having the second property.

7. The imaging device according to claim 6,
wherein the first optical system and the second optical system have a common optical axis.

8. The imaging device according to claim 7,
wherein the first optical system is a circular central optical system, and the second optical system is an annular optical system that is concentrically arranged with respect to the central optical system.

9. The imaging device according to claim 6,
wherein the first optical system and the second optical system are different from each other in terms of at least one of a focal length, a focal distance, or a modulation transfer function.

10. An imaging device comprising:
a multiple-property lens that includes a first area having a first property and a second area having a second property different from the first property;
an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other; and
a crosstalk removal processing unit that removes a crosstalk component from each of a first crosstalk image acquired from the first light receiving element of the image sensor and a second crosstalk image acquired from the second light receiving element to generate a first image and a second image respectively having the first property and the second property of the multiple-property lens.

11. The imaging device according to claim 10,
wherein the crosstalk removal processing unit calculates the first image and the second image on the basis of the first crosstalk image, the second crosstalk image, and an inverse matrix of a matrix configured of a detected gain distribution and a crosstalk gain distribution of each of the first crosstalk image and the second crosstalk image.

12. The imaging device according to claim 10,
wherein the first microlens and the second microlens are different from each other in terms of at least one of a radius of curvature or a distance from the light receiving surface of the first light receiving element and from the light receiving surface of the second light receiving element.

13. An imaging method in an imaging device including a multiple-property lens that includes a first area having a first property and a second area having a second property different from the first property, and an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged, the method comprising:
a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element; and
a step of generating a first image and a second image respectively having the first property and the second property of the multiple-property lens by removing a crosstalk component from each of the first crosstalk image and the second crosstalk image acquired.

14. The imaging method according to claim 13,
wherein in the step of generating the first image and the second image, the first image and the second image are calculated on the basis of the first crosstalk image, the second crosstalk image, and an inverse matrix of a matrix configured of a detected gain distribution and a crosstalk gain distribution of each of the first crosstalk image and the second crosstalk image.

15. An imaging method in an imaging device including a multiple-property lens that includes a first area having a first property and a second area having a second property different from the first property, and an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other being two-dimensionally arranged, the method comprising:
a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element; and
a step of generating a first image and a second image respectively having the first property and the second property of the multiple-property lens by removing a crosstalk component from each of the first crosstalk image and the second crosstalk image acquired.

16. The imaging method according to claim 15,
wherein in the step of generating the first image and the second image, the first image and the second image are calculated on the basis of the first crosstalk image, the second crosstalk image, and an inverse matrix of a matrix configured of a detected gain distribution and a crosstalk gain distribution of each of the first crosstalk image and the second crosstalk image.

17. A non-transitory computer readable recording medium storing an image processing program of an imaging device including a multiple-property lens that includes a first area having a first property and a second area having a second property different from the first property, and an image sensor that has a first light receiving element having a first microlens and a second light receiving element having a second microlens having a different focusing degree from the first microlens, the first light receiving element on which a luminous flux passing the first area of the multiple-property lens and a luminous flux passing the second area of the multiple-property lens are incident in crosstalk with each other through the first microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other through the second microlens being two-dimensionally arranged, the program causing a computer to realize:
a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element; and
a step of generating a first image and a second image respectively having the first property and the second property of the multiple-property lens by removing a crosstalk component from each of the first crosstalk image and the second crosstalk image acquired.

18. The non-transitory computer readable recording medium storing the image processing program according to claim 17,
wherein in the step of generating the first image and the second image, the first image and the second image are calculated on the basis of the first crosstalk image, the second crosstalk image, and an inverse matrix of a matrix configured of a detected gain distribution and a crosstalk gain distribution of each of the first crosstalk image and the second crosstalk image.

19. A non-transitory computer readable recording medium storing an image processing program of an imaging device including a multiple-property lens that includes a first area having a first property and a second area having a second property different from the first property, and an image sensor that has a first light receiving element having a microlens and a second light receiving element not having a microlens, the first light receiving element on which a luminous flux passing the first area of the multiple-property lens and a luminous flux passing the second area of the multiple-property lens are incident in crosstalk with each other through the microlens and the second light receiving element having a different crosstalk ratio due to having a different focusing degree from the first light receiving element and on which the luminous flux passing the first area of the multiple-property lens and the luminous flux passing the second area of the multiple-property lens are incident in crosstalk with each other being two-dimensionally arranged, the program causing a computer to realize:

a step of acquiring a first crosstalk image and a second crosstalk image that are imaged by the imaging device at the same time, the first crosstalk image being photoelectrically converted by the first light receiving element of the image sensor, and the second crosstalk image being photoelectrically converted by the second light receiving element; and a step of generating a first image and a second image respectively having the first property and the second property of the multiple-property lens by removing a crosstalk component from each of the first crosstalk image and the second crosstalk image acquired.

20. The non-transitory computer readable recording medium storing the image processing program according to claim 19, wherein in the step of generating the first image and the second image, the first image and the second image are calculated on the basis of the first crosstalk image, the second crosstalk image, and an inverse matrix of a matrix configured of a detected gain distribution and a crosstalk gain distribution of each of the first crosstalk image and the second crosstalk image.

* * * * *